United States Patent
Yang et al.

(10) Patent No.: US 11,901,380 B2
(45) Date of Patent: Feb. 13, 2024

(54) SOLID-STATE IMAGE SENSOR

(71) Applicant: VisEra Technologies Company Limited, Hsin-Chu (TW)

(72) Inventors: Hui-Min Yang, Hsinchu (TW); Zong-Ru Tu, Zhubei (TW); Yu-Chi Chang, Hukou Township, Hsinchu County (TW); Han-Lin Wu, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 262 days.

(21) Appl. No.: 17/106,706

(22) Filed: Nov. 30, 2020

(65) Prior Publication Data

US 2022/0173138 A1    Jun. 2, 2022

(51) Int. Cl.
*H01L 27/32* (2006.01)
*H01L 27/146* (2006.01)
*H04N 25/00* (2023.01)

(52) U.S. Cl.
CPC ...... *H01L 27/1461* (2013.01); *H01L 27/1463* (2013.01); *H01L 27/14605* (2013.01); *H01L 27/14627* (2013.01); *H04N 25/00* (2023.01)

(58) Field of Classification Search
None
See application file for complete search history.

(56) References Cited

U.S. PATENT DOCUMENTS

| | | | |
|---|---|---|---|
| 2016/0013231 A1* | 1/2016 | Lee | H01L 27/14623 257/432 |
| 2016/0380032 A1* | 12/2016 | Park | H01L 27/14649 257/40 |
| 2019/0035838 A1* | 1/2019 | Byun | H01L 23/50 |

(Continued)

FOREIGN PATENT DOCUMENTS

| | | |
|---|---|---|
| CN | 108417595 A | 8/2018 |
| JP | H08149310 A | 6/1996 |

(Continued)

OTHER PUBLICATIONS

Office Action with the search report of its corresponding TW application No. 110119655 dated Mar. 17, 2022.

*Primary Examiner* — Ali Naraghi
(74) *Attorney, Agent, or Firm* — MUNCY, GEISSLER, OLDS & LOWE, PC

(57) ABSTRACT

A solid-state image sensor is provided. The solid-state image sensor includes a semiconductor substrate having photoelectric conversion elements. The photoelectric conversion elements form an N×N pixel array, where N is a positive integer larger than or equal to 3. The solid-state image sensor also includes a modulation layer disposed above the photoelectric conversion elements. The solid-state image sensor further includes a light-adjusting structure disposed on the modulation layer and corresponding to the N×N pixel array. The N×N pixel array includes a first pixel region having at least one first pixel. The N×N pixel array also includes a second pixel region adjacent to the first pixel region in a first direction and in a second direction different from the first direction and having second pixels. The aperture ratio of the first pixel and the aperture ratio of the second pixel are different.

19 Claims, 32 Drawing Sheets

(56) References Cited

U.S. PATENT DOCUMENTS

2019/0237518 A1* 8/2019 Sun .................... H10K 50/11
2022/0173138 A1* 6/2022 Yang .................. H01L 27/1463

FOREIGN PATENT DOCUMENTS

| JP | 2019-180048 A | 10/2019 |
| KR | 1020170051304 | 5/2017 |
| KR | 1020190035564 | 4/2019 |
| TW | 201719875 A | 6/2017 |
| TW | 201911548 A | 3/2019 |
| WO | WO2012/073402 A1 | 5/2014 |

* cited by examiner

SOLID-STATE IMAGE SENSOR

BACKGROUND

Technical Field

The embodiments of the present disclosure relate to image sensors, and in particular they relate to solid-state image sensors with a floating pixel design,

Description of the Related Art

Solid-state image sensors (e.g., complementary metal-oxide semiconductor (CMOS) image sensors) have been widely used in various image-capturing apparatuses such as digital still-image cameras, digital video cameras, and the like. Signal electric charges may be generated according to the amount of light received in the light-sensing portion (e.g., photoelectric conversion element) of the solid-state image sensor. In addition, the signal electric charges generated in the light-sensing portion may be transmitted and amplified, whereby an image signal is obtained.

With the development of image sensors towards small pixels (e.g., pixel size smaller than 0.7 μm), lower sensitivity may occur due to the smaller light-receiving area of small pixels. In traditional solid-state image sensors, one micro-lens corresponding to multi-pixels may be used to increase the amount of light, thereby increasing quantum efficiency (QE) and/or sensitivity. However, this structure may be easy to cause unevenness of each pixel and increase channel separation.

Moreover, incident light is often concentrated into the isolation structure (e.g., shallow trench isolation (STI) or deep trench isolation (DTI)) in the substrate of the traditional solid-state image sensors, which may cause light scattering and reduce the image quality. Therefore, there are still various challenges to be overcome in the design of solid-state image sensors.

BRIEF SUMMARY

In the solid-state image sensor according to some embodiments of the present disclosure, the aperture ratios in different pixel regions may be different, which may optimize optical allocation (e.g., prevent incident light from being concentrated into the isolation structure or prevent uneven light intensity received by the photoelectric conversion elements), thereby improving the quality of the image signal from the photoelectric conversion elements of the solid-state image sensor.

In accordance with some embodiments of the present disclosure, a solid-state image sensor is provided. The solid-state image sensor includes a semiconductor substrate having photoelectric conversion elements. The photoelectric conversion elements form an N×N pixel array, where N is a positive integer larger than or equal to 3. The solid-state image sensor also includes a modulation layer disposed above the photoelectric conversion elements. The solid-state image sensor further includes a light-adjusting structure disposed on the modulation layer and corresponding to the N×N pixel array. The N×N pixel array includes a first pixel region having at least one first pixel. The N×N pixel array also includes a second pixel region that is adjacent to the first pixel region in a first direction and a second direction and having second pixels. The first direction and the second direction are different. The aperture ratio of the first pixel and the aperture ratio of one of the second pixels are different.

In some embodiments, the light-adjusting structure is a converging micro-lens.

In some embodiments, the solid-state image sensor further includes a grid. structure disposed in the modulation layer to divide the modulation layer into a first modulation segment corresponding to the first pixel and second modulation segments corresponding to the second pixels. The material of the grid structure includes a transparent dielectric material that has a refractive index in a range from 1 to 1.99, or the grid structure is air.

In some embodiments, the bottom area of the first modulation segment is smaller than the bottom area of one of the second modulation segments.

In some embodiments, the ratio of the bottom area of the first modulation segment to the bottom area of one of the second modulation segments is smaller than 0.5, and the first modulation segment is filled with green, yellow or transparent material.

In some embodiments, when the incident light comes from a first side of the first modulation segment, the aperture ratio of one of the second modulation segments on a second side opposite the first side of the first modulation segment is smaller than the aperture ratio of another of the second modulation segments on the first side of the first modulation segment.

In some embodiments, the N×N pixel array further includes a third pixel region adjacent to the second pixel region in the first direction and in the second direction and having third pixels, and the aperture ratio of one of the third pixels is different from the aperture ratio of the first pixel and the aperture ratio of one of the second pixels.

In some embodiments, the grid structure between the first modulation segment and one of the second modulation segments has a first grid width. The grid structure between one of the second modulation segments and one of the third modulation segments has a second grid width. The first grid width is greater than the second grid width.

In some embodiments, the solid-state image sensor further includes a metal grid disposed on a bottom of the grid structure.

In some embodiments, the solid-state image sensor further includes a metal grid disposed in the modulation layer to divide the modulation layer into a first modulation segment and second modulation segments. The first modulation segment corresponds to the first pixel. The second modulation segments correspond to the second pixels. The metal grid between the first modulation segment and one of the second modulation segments has a first metal width. The metal grid surrounding the modulation layer has a second metal width. The first metal width is greater than the second metal width.

In some embodiments, the top area of one of the photoelectric conversion elements that corresponds to the first pixel is smaller than the top area of another of the photoelectric conversion elements that corresponds to one of the second pixels.

In some embodiments, the light-adjusting structure is a diverging micro-lens.

In some embodiments, the bottom area of the first modulation segment is greater than the bottom area of one of the second modulation segments.

In some embodiments, the top area of one of the photoelectric conversion elements that corresponds to the at least one first pixel is greater than the top area of another of the photoelectric conversion elements that corresponds to one of the second pixels.

In some embodiments, the solid-state image sensor further includes a grid structure disposed in the modulation layer and a color filter layer disposed on the modulation layer. The refractive index of the grid structure is lower than the refractive index of the modulation layer.

In some embodiments, the solid-state image sensor further includes an air gap disposed in the grid structure that corresponds to the space between the first pixel region and the second pixel region.

In some embodiments, the ratio of the thickness of the modulation layer to the thickness of the color filter layer is between 0.25 and 1.

In some embodiments, aperture ratios in the N×N pixel array are changed along the radiation direction of the light-adjusting structure.

In some embodiments, N=2n and n is a positive integer, the first pixel region corresponds to four photoelectric conversion elements, and the four photoelectric conversion elements form P-N junctions In some embodiments, the pixel arrays form a mosaic pattern, and the mosaic pattern comprises RGB arrangement, CMY arrangement or RYYB arrangement.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

Figure 1:
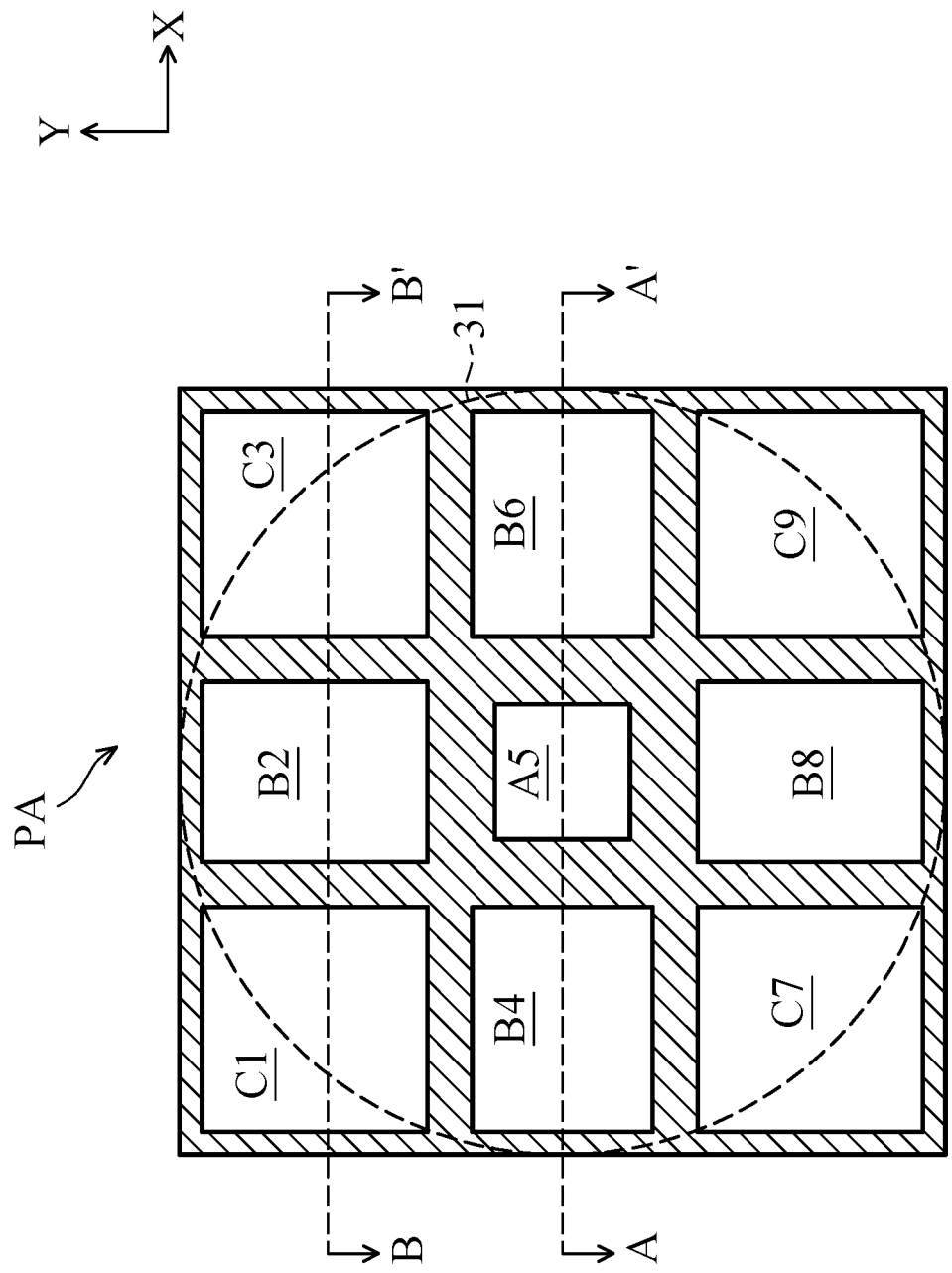
FIG. 1 is a partial top view illustrating the solid-state image sensor in accordance with some embodiments of the present disclosure.
Figure 2A:
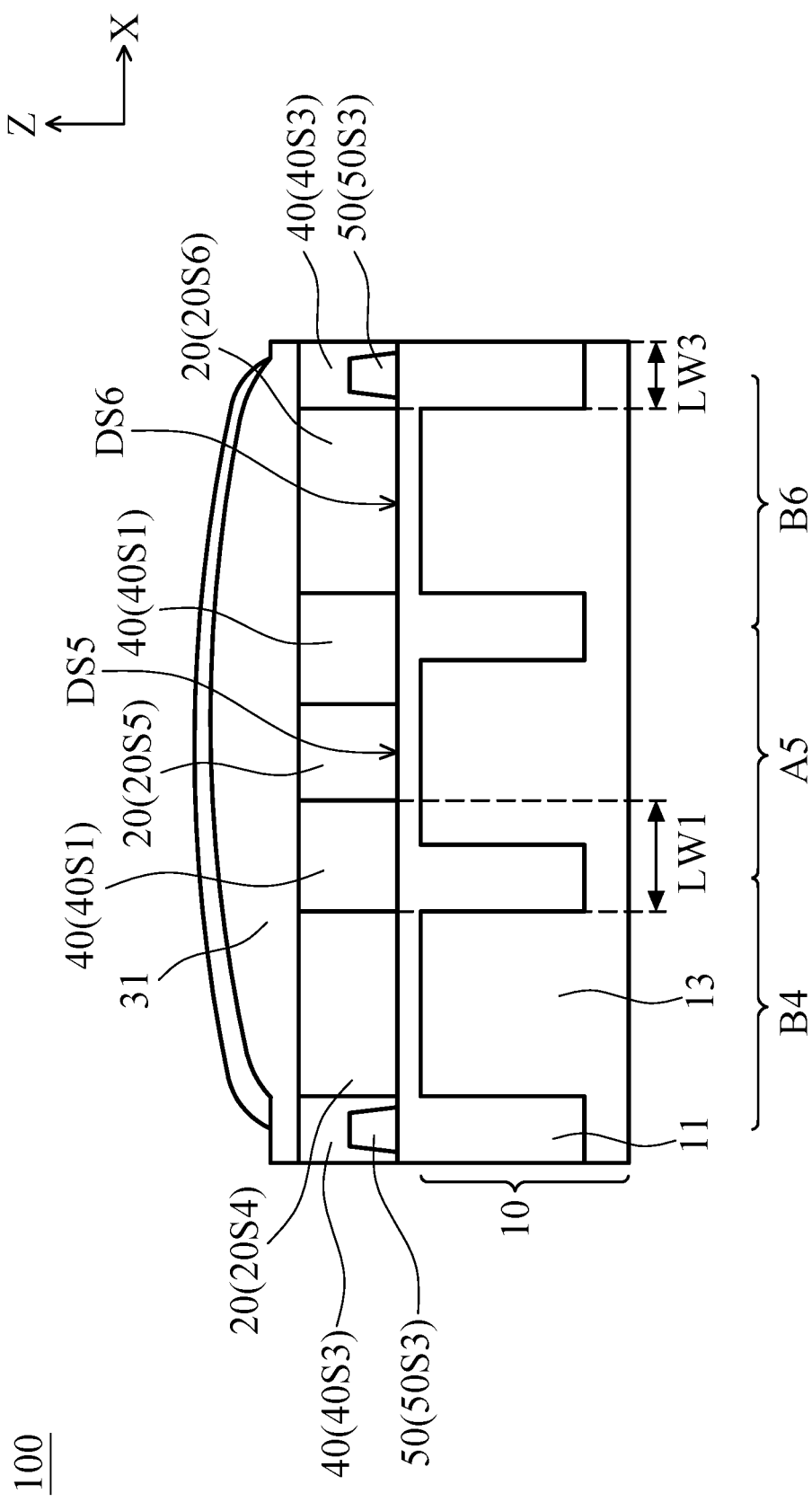
FIG. 2A is a partial cross-sectional view of the solid-state image sensor along line A-A' in FIG. 1.
Figure 2B:
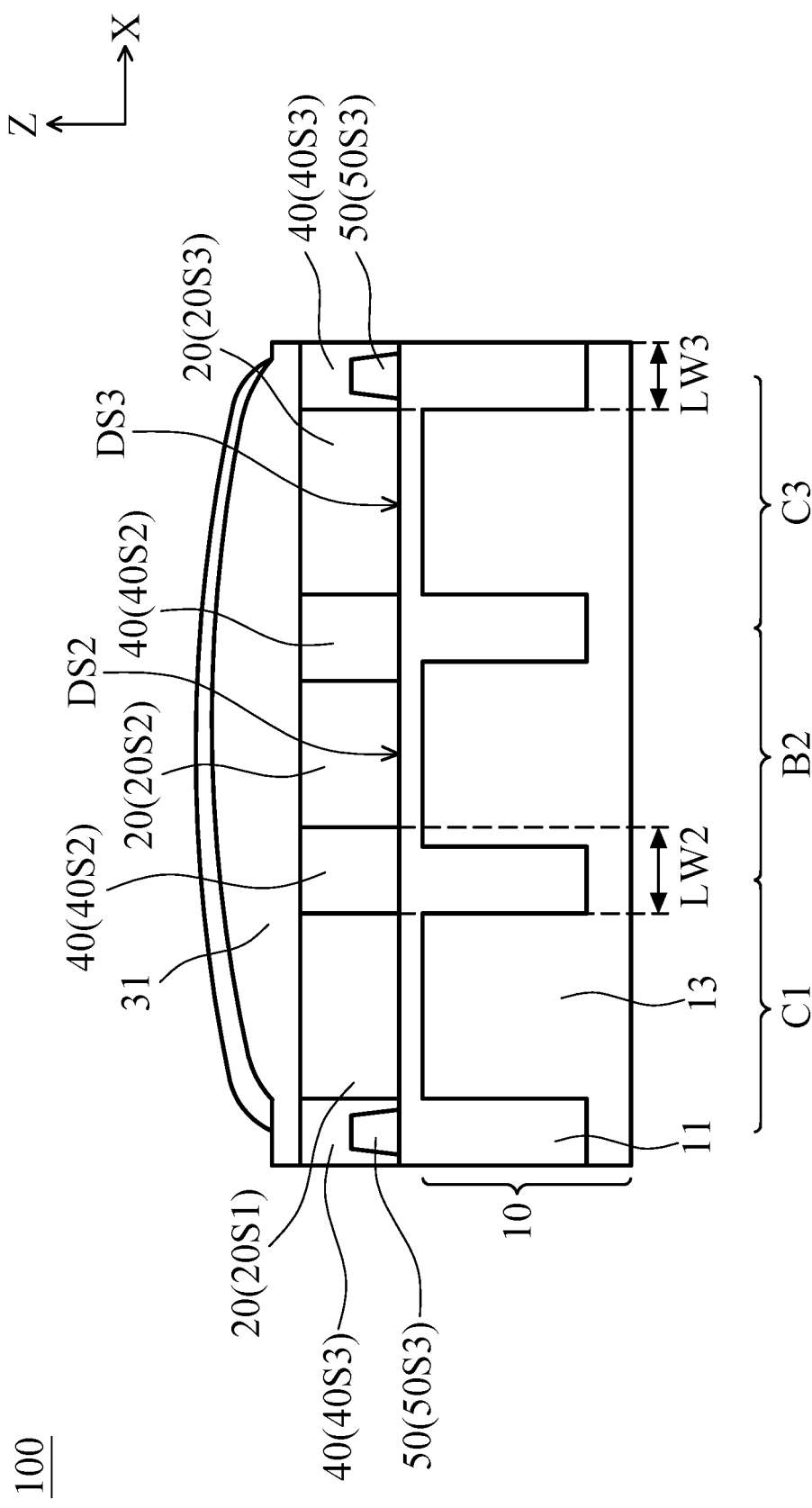
FIG. 2B is a partial cross-sectional view of the solid-state image sensor along line B-B' in FIG. 1.

FIG. 1 is a partial top view illustrating the solid-state image sensor 100 in accordance with some embodiments of the present disclosure. FIG. 2A is a partial cross-sectional view of the solid-state image sensor 100 along line A-A' in FIG. 1. FIG. 2B is a partial cross-sectional view of the solid-state image sensor 100 along line B-B' in FIG. 1. It should be noted that some components of the solid-state image sensor 100 may be omitted in FIG. 1, FIG. 2A and FIG. 2B for the sake of brevity.

In some embodiments, the solid-state image sensor 100 may be a complementary metal-oxide semiconductor (CMOS) image sensor or a charge coupled device (CCD) image sensor, but the present disclosure is not limited thereto.

It should be noted that FIG. 1 merely shows one pixel array PA that includes pixel C1, pixel B2, pixel C3, pixel B4, pixel A5, pixel B6, pixel C7, pixel B8, and pixel C9 that correspond to one light-adjusting structure 31. That is, the pixel array PA may be a 3×3 pixel array that corresponds to one light-adjusting structure 31, and the pixel array PA may correspond to 3×3 photoelectric conversion elements 13 (shown in FIG. 2A and FIG. 2B).

As shown in FIG. 1, the pixel array PA may include a first pixel region having pixel A5 and a second pixel region adjacent to the first pixel region in the X-direction and the Y-direction and having pixel B2, pixel B4, pixel B6, and pixel B8. In some embodiments, the pixel array PA may further include a third pixel region adjacent to the second pixel region in the X-direction and the Y-direction and having pixel C1, pixel C3, pixel C7, and pixel C9. As shown in FIG. 1, pixel B2 and pixel B8 are respectively disposed on the upper and lower sides of pixel A5, and pixel B4 and pixel B6 are respectively disposed on the left and right sides of pixel A5. Moreover, pixel C1 (or pixel C3. pixel C7, or pixel C9) and pixel A5 are diagonally arranged.

Referring to FIG. 1, pixel B2, pixel B4, pixel B6, pixel B8 may have the same aperture ratio, and pixel C1, pixel C3, pixel C7, pixel C9 may have the same aperture ratio. Moreover, the aperture ratio of pixel A5, the aperture ratio of pixel B2 (or pixel B4, pixel B6, or pixel B8), and the aperture ratio of pixel C1 (or pixel C3, pixel C7, or pixel C9) may be different. In the embodiment shown in FIG. 1, the aperture ratio of pixel A5 is smaller than the aperture ratio of pixel B2 (or pixel B4, pixel B6, or pixel B8), and the aperture ratio of pixel B2 (or pixel B4, pixel B6, or pixel B8) is smaller than the aperture ratio of pixel C1 (or pixel C3, pixel C7, or pixel C9).

Referring to FIG. 2A and FIG. 2B, the solid-state image sensor 100 includes a semiconductor substrate 10 having photoelectric conversion elements 13. In some embodiments, the semiconductor substrate 10 may be a wafer or a chip. For example, the semiconductor substrate 10 may include silicon.

As shown in FIG. 2A and FIG. 2B, the solid-state image sensor 100 may include isolation structures 11 disposed in the semiconductor substrate 10. In some embodiments, the isolation structures 11 may include shallow trench isolations (STI) or deep trench isolations (DTI). For example, the isolation structures 11 may be formed in the semiconductor substrate 10 using an etching process to form trenches and filling the trenches with an insulating or dielectric material.

In the embodiment shown in FIG. 2A and FIG. 2B, the isolation structures 11 includes deep trench isolations (DTI) that have the same depth. In some other embodiments, the depth of the isolation structure 11 may be variable. That is, the depths of the isolation structures 11 may be different.

In some embodiments, the isolation structures 11 may define the photoelectric conversion elements 13. That is, the photoelectric conversion elements 13 in the semiconductor substrate 10 may be isolated from each other by the isolation structures 11. In some embodiments, the photoelectric conversion elements 13 may be photodiodes.

In some embodiments, a high dielectric-constant (high-κ) film and/or a buffer layer may be formed on the semiconductor substrate 10 and covering the photoelectric conversion elements 13. For example, the material of the high-κ film may include hafnium oxide ($HfO_2$), hafnium tantalum oxide (HfTaO), hafnium titanium oxide (HfTiO), hafnium zirconium oxide (HrZrO), tantalum pentoxide ($Ta_2O_5$), other suitable high-κ dielectric materials, or a combination thereof, and the material of the buffer layer may include silicon oxides, silicon nitrides, silicon oxynitrides, other suitable insulating materials, or a combination thereof.

Referring to FIG. 2A and FIG. 2B, the solid-state image sensor 100 includes a modulation layer 20 disposed above the photoelectric conversion elements 13. In some embodiments, the material of the modulation layer 20 may include dielectric material that has a refractive index in a range from about 1.0 to about 2.0.

In the embodiments of the present disclosure, the modulation layer 20 may be used for adjusting the light intensity received by the photoelectric conversion elements 13. In some embodiments, the modulation layer 20 may be a color filter layer, such as a red (R) color filter layer, a green (G) color filter layer, or a blue (B) color filter layer. In some other embodiments, the modulation layer 20 may be a white (W) color filter layer, a cyan (C) color filter layer, a magenta (M) color filter layer, a yellow (Y) color filter layer, any other applicable color filter layer, or a combination thereof.

In some embodiments, the modulation layer 20 has (or may be divided into) a plurality of modulation segments, such as the modulation segment 20S4, the modulation segment 20S5, and the modulation segment 20S6 shown in FIG. 2A, or the modulation segment 20S1, the modulation segment 20S2, and the modulation segment 20S3 shown in FIG 2B. In this embodiment, each modulation segment corresponds to one photoelectric conversion element 13. In some other embodiments, each modulation segment may correspond to at least two photoelectric conversion elements 13.

Referring to FIG. 2A and FIG. 2B, the solid-state image sensor 100 includes a light-adjusting structure 31 disposed on the modulation layer 20, and the light-adjusting structure 31 may correspond to the pixel array PA. That is, the light-adjusting structure 31 may correspond to nine pixels (i.e., pixel C1, pixel B2, pixel C3, pixel B4, pixel A5, pixel B6, pixel C7, pixel B8, and pixel C9).

In some embodiments, the light-adjusting structure 31 may be a converging micro-lens used for condensing incident light. In some embodiments, the material of the light-adjusting structure 31 may include glass, epoxy resin, silicone resin, polyurethane, any other applicable material, or a combination thereof. For example, the light-adjusting structure 31 may be a convex micro-lens as show in FIG. 2A and FIG. 2B.

Referring to FIG. 2A and FIG. 2B, in some embodiments, the solid-state image sensor 100 may include a grid structure 40 disposed in the modulation layer 20. In some embodiments, the material of the grid structure 40 may include a transparent dielectric material that has a refractive index in a range from about 1 to about 1.99 (e.g., lower than or equal to 1.4) or the grid structure 40 may be air, and the refractive index of the grid structure 40 is lower than the refractive index of the modulation layer 20.

In some embodiments, the grid structure 40 may divide the modulation layer 20 into the modulation segments. For example, the grid structure 40 may divide the modulation layer 20 into the modulation segment 20S5 (that corresponds to pixel A5), the modulation segment 20S2, the modulation segment 20S4, the modulation segment 20S6 (that respectively correspond to pixel B2, pixel B4, pixel B6), and the modulation segment 20S1, the modulation segment 20S3 (that respectively correspond to pixel C1, pixel C3) as shown in FIG. 2A and FIG. 2B.

In this embodiment, the light-adjusting structure 31 is a converging micro-lens, and the light-adjusting structure 31 corresponds to the pixel array PA (having nine (3×3) pixels). The incident light will be stronger on the center than on the periphery of the pixel array PA due to the (converging) light-adjusting structure 31. For pixel uniformity, the aperture ratio of each pixel may be modified to improve the pixel uniformity.

As shown in FIG. 1, FIG. 2A and FIG. 2B, the grid structure 40 may determine the aperture ratio of each pixel, so that the aperture ratio of pixel A5 is smaller than the aperture ratio of pixel B2 (or pixel B4, pixel B6, or pixel B8), and the aperture ratio of pixel B2 (or pixel B4, pixel B6, or pixel B8) is smaller than the aperture ratio of pixel C1 (or pixel C3, pixel C7, or pixel C9). For example, the grid structure 40 between the modulation segment 20S5 and the modulation segment 20S4 (or the modulation segment 20S6) may have a grid width LW1 (i.e., the grid structure 40S1 shown in FIG. 2A), and the grid structure 40 between the modulation segment 20S2 and the modulation segment 20S1 (or the modulation segment 20S3) may have a grid width LW2 (i.e., the grid structure 40S2 shown in FIG. 2B), and the grid width LW1 is greater than the grid width LW2. Moreover, the grid structure 40 surrounding the modulation layer 20 may have a grid LW3 (i.e., the grid structure 40S3 shown in FIG. 2A and FIG. 2B), and the grid width LW2 is greater than the grid width LW3.

In the embodiment shown in FIG. 2A and FIG. 2B, since the grid width LW1 is greater than the grid width LW2 and the grid width LW2 is greater than the grid width LW3, the bottom area DS5 of the modulation segment 20S5 is smaller than the bottom area DS6 (or DS2) of the modulation segment 20S6 (or 20S2) and the bottom area. DS2 (or DS6) of the modulation segment 20S2 (or 20S6) is smaller than the bottom area DS3 of the modulation segment 20S3. Therefore, the aperture ratios in different pixel regions of the solid-state image sensor 100 may be different from each other as shown in FIG. 1

Since the aperture ratios in different pixel regions of the solid-state image sensor 100 may be different, it may optimize optical allocation (e.g., prevent incident light from being concentrated into the isolation structures 11 or prevent uneven light intensity received by the photoelectric conversion elements 13), thereby improving the quality of the image signal from the photoelectric conversion elements 13 of the solid-state image sensor 100.

Figure 2C:
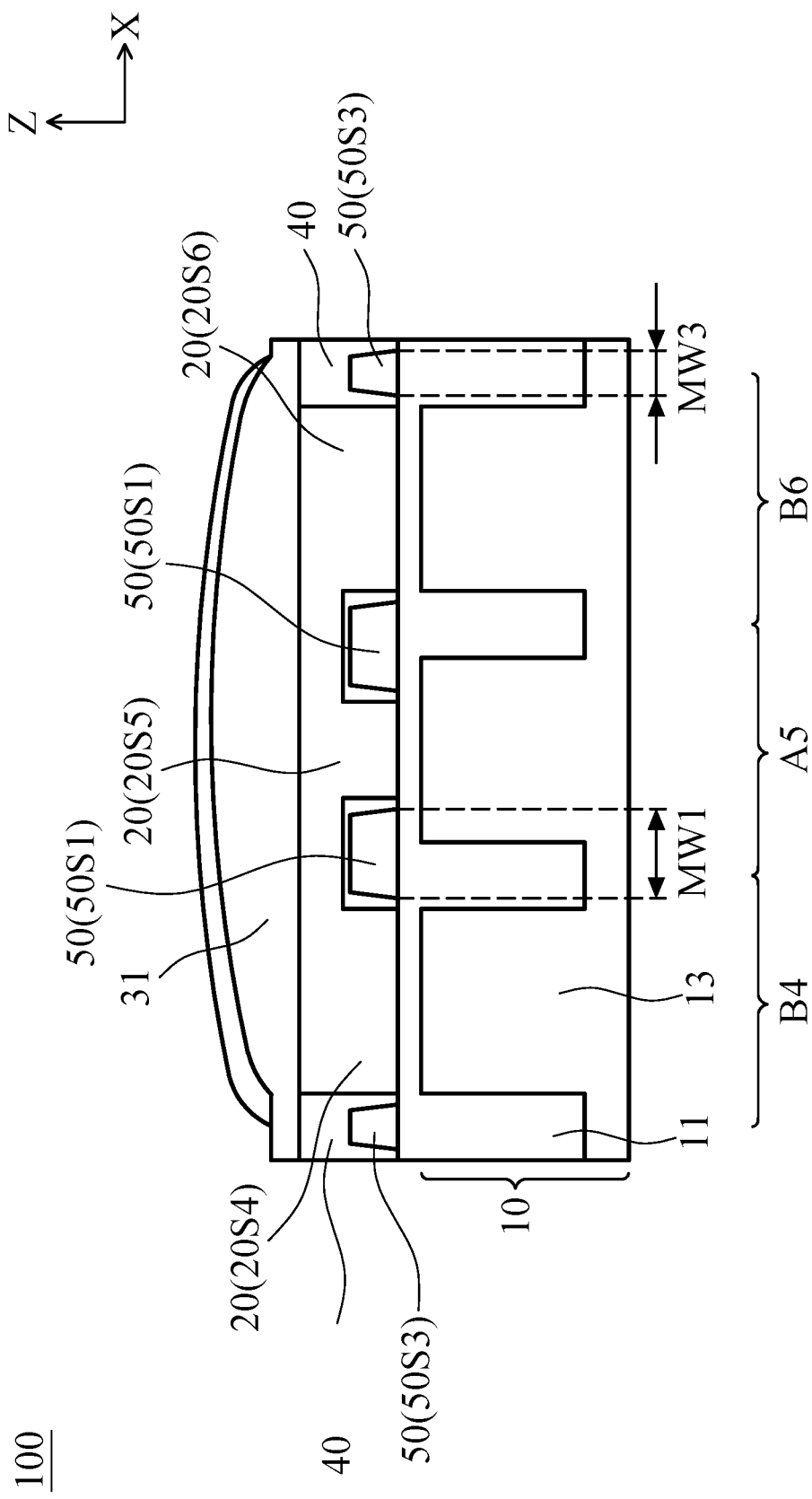
FIG. 2C is a partial cross-sectional view of the solid-state image sensor along line A-A' in FIG. 1 according to another embodiment of the present disclosure.

FIG. 2C is a partial cross-sectional view of the solid-state image sensor 100 along line A-A' in FIG. 1 according to another embodiment of the present disclosure. Referring to FIG. 2C, in some embodiments, the solid-state image sensor 100 may include a metal grid 50 disposed in the modulation layer 20. In some embodiments, the material of the metal grid 50 may include tungsten (W), aluminum (Al), metal nitride (e.g., titanium nitride (TiN)), any other applicable material, or a combination thereof.

In some embodiments, as shown in FIG. 2C, a portion of the metal grid 50 (i.e., the metal grid 50S3) may be disposed on the bottom of the grid structure 40, and the metal grid 50 may divide the modulation layer 20 into the modulation segments. For example, the metal grid 50 may divide the modulation layer 20 into the modulation segment 20S5 (that corresponds to pixel A5), the modulation segment 20S2 (that corresponds to pixel B2) (not shown in FIG. 2C), the modulation segment 20S4, the modulation segment 20S6 (that respectively correspond to pixel B4, pixel B6), and the modulation segment 20S1, the modulation segment 20S3 (that respectively correspond to pixel C1, pixel C3) (not shown in FIG. 2C).

Similarly, in this embodiment, as shown in FIG. 1 and FIG. 2C, the metal grid 50 may determine the aperture ratio of each pixel, so that the aperture ratios in different pixel regions of the solid-state image sensor 100 may be different from each other as shown in FIG. 1. For example, the metal grid 50 between the modulation segment 20S5 and the modulation segment 20S4 (or the modulation segment 20S6) may have a metal width MW1 (i.e., the metal grid 50S1 shown in FIG. 2C), the metal grid 50 surrounding the modulation layer 20 may have a metal width MW3 (i.e., the metal grid 50S3 shown in FIG. 2C), and the metal width MW1 is greater than the metal width MW3.

Moreover, in some embodiments, the metal grid 50 between the modulation segment 20S2 and the modulation segment 20S1 (or the modulation segment 20S3) (not shown in FIG. 2C) may have another metal width that is smaller than the metal width MW1 and greater than the metal width MW3.

Figure 2D:
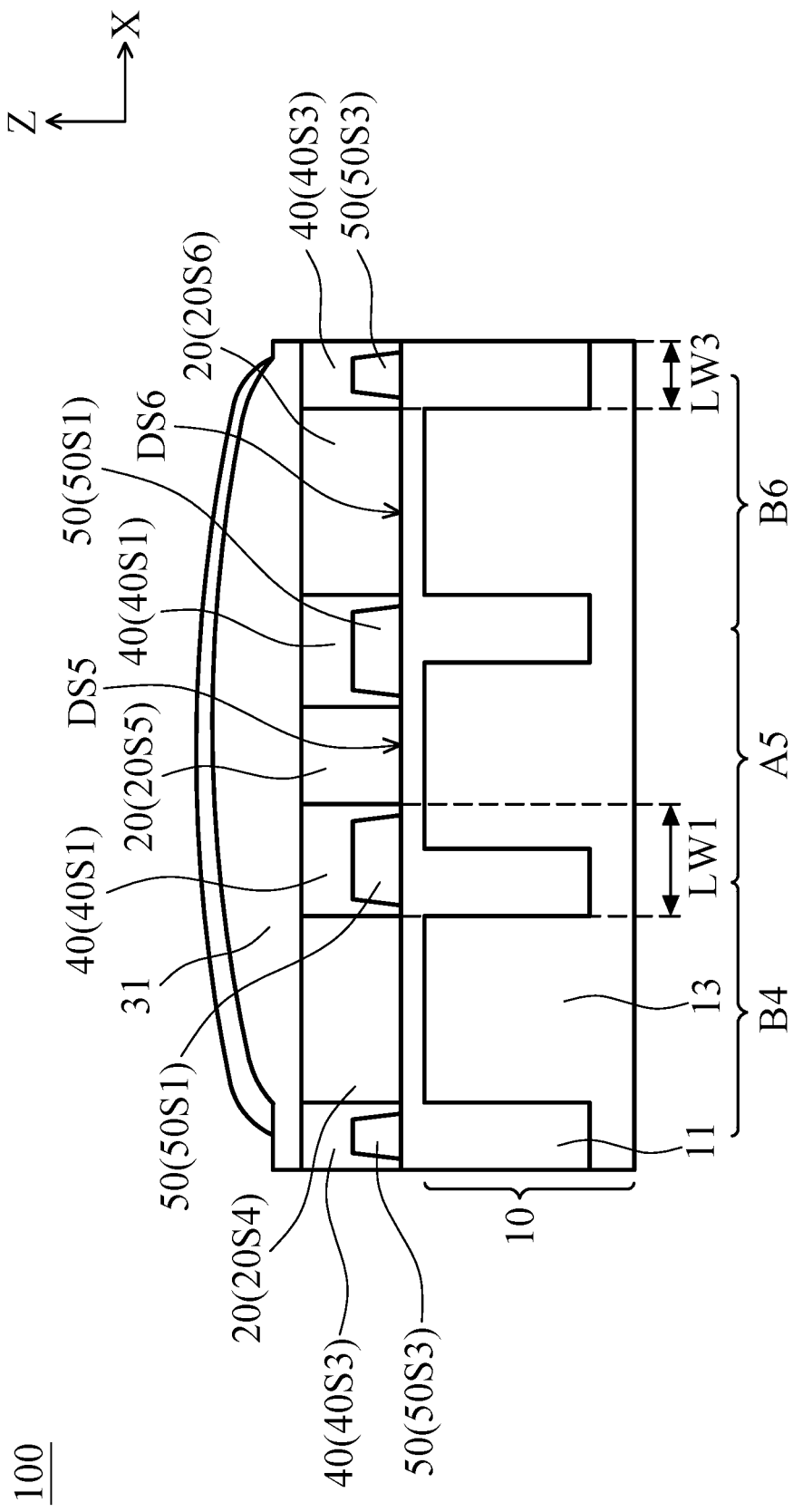
FIG. 2D is a partial cross-sectional view of the solid-state image sensor along line A-A' in FIG. 1 according to another embodiment of the present disclosure.

FIG. 2D is a partial cross-sectional view of the solid-state image sensor 100 along line A-A' in FIG. 1 according to another embodiment of the present disclosure. The solid-state image sensor 100 shown in FIG. 2D is similar to the solid-state image sensor 100 shown in FIG. 2B. One of the differences from the solid-state image sensor 100 shown in FIG. 2B is that the solid-state image sensor 100 shown in FIG. 2D may further include a metal grid 50 disposed on the bottom of the grid structure 40.

Similarly, in this embodiment, as shown in FIG. 1 and FIG. 2D, the grid structure 40 (that includes the metal grid 50 on the bottom) may determine the aperture ratio of each pixel, so that the aperture ratios in different pixel regions of the solid-state image sensor 100 may be different from each other as shown in FIG. 1. For example, the grid width LW1 is greater than the grid width LW3, so that the bottom area DS5 of the modulation segment 20S5 is smaller than the bottom area DS6 (or DS2) of the modulation segment 20S6 (or 20S2).

Figure 2E:
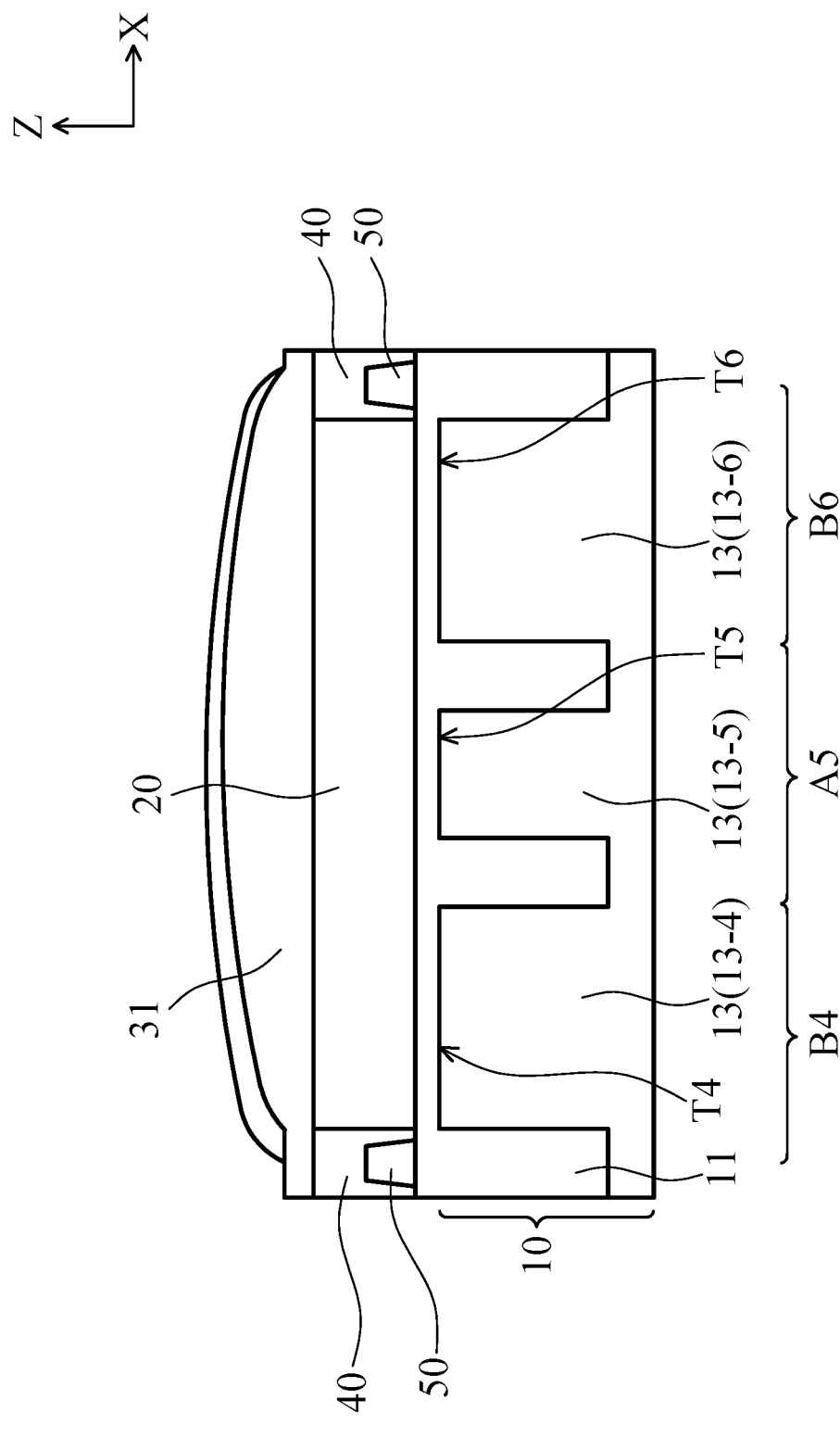
FIG. 2E, is a partial cross-sectional view of the solid-state image sensor along line A-A' in FIG. 1 according to another embodiment of the present disclosure.

FIG. 2E is a partial cross-sectional view of the solid-state image sensor 100 along line A-A' in FIG. 1 according to another embodiment of the present disclosure. Referring to FIG. 2E. in some embodiment, the photoelectric conversion elements 13 of the solid-state image sensor 100 may be different from each other duo to the shift of the isolation structures 11. For example, the locations of the isolation structures 11 may be adjusted to form different photoelectric conversion elements 13.

As shown in FIG. 2E, the photoelectric conversion elements 13-4 may correspond to pixel B4, the photoelectric conversion elements 13-5 may correspond to pixel A5, and the photoelectric conversion elements 13-6 may correspond to pixel B6. In this embodiment, as shown in FIG. 1 and FIG. 2E. the isolation structures 11 (i.e., the shift of the isolation structures 11) may determine the aperture ratio of each pixel, so that the aperture ratios in different pixel regions of the solid-state image sensor 100 may be different from each other as shown in FIG. 1.

For example, the top area T5 of the photoelectric conversion element 13-5 that corresponds to pixel A5 may be smaller than the top area T4 of the photoelectric conversion element 13-4 that corresponds to pixel B4 or the top area T6 of the photoelectric conversion element 13-6 that corresponds to pixel B6. In some embodiments, the top area T4 of the photoelectric conversion element 13-4 that corresponds to pixel B4 (or the top area T6 of the photoelectric conversion element 13-6 that corresponds to pixel B6) may be smaller than the top area of the photoelectric conversion element at corresponds to pixel C1 (or pixel C3, pixel C7, or pixel C9) (not shown in FIG. 2E).

Figure 2F:
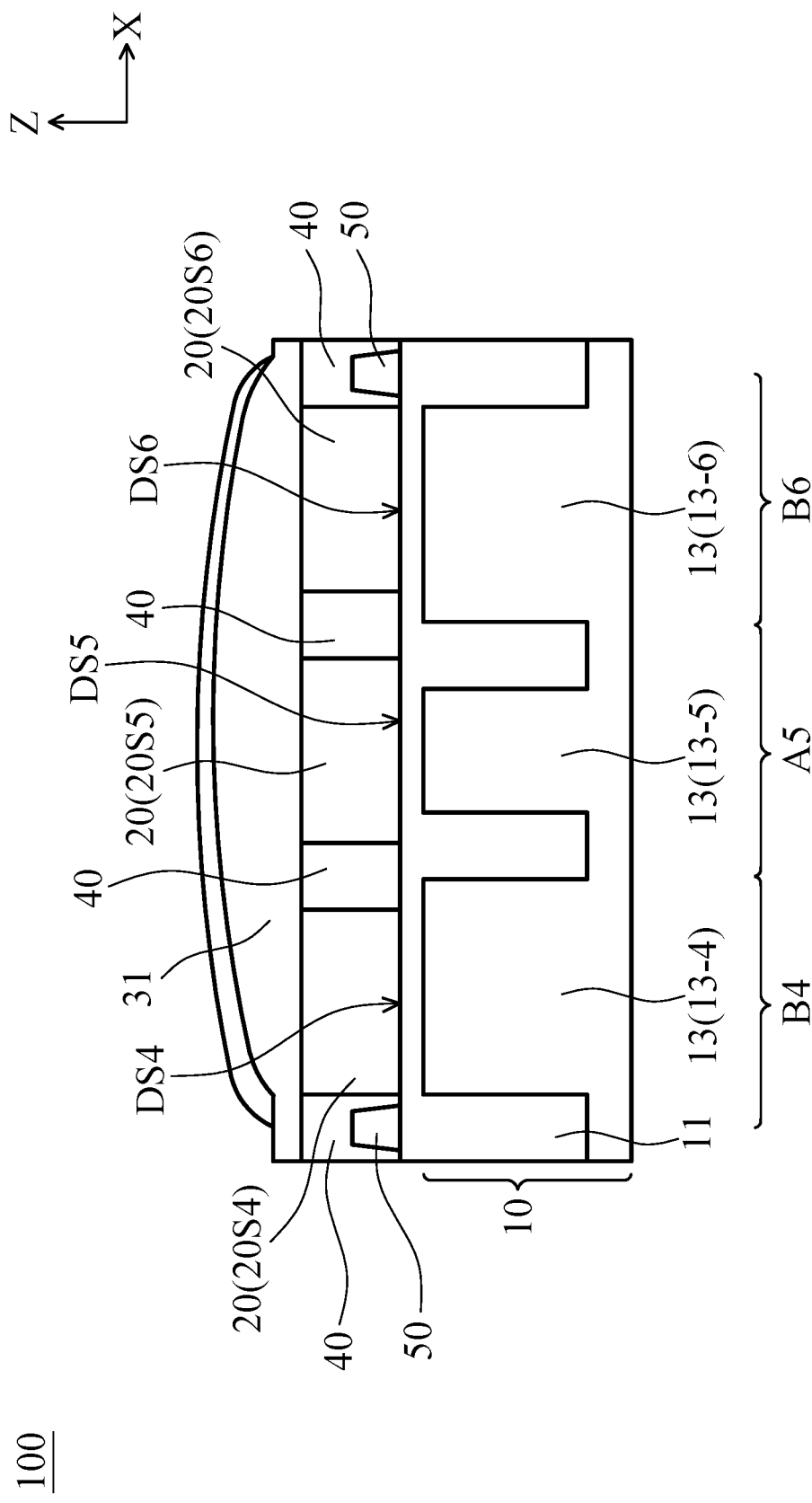
FIG. 2F is a partial cross-sectional view of the solid-state image sensor along line A-A' in FIG. 1 according to another embodiment of the present disclosure.
Figure 2G:
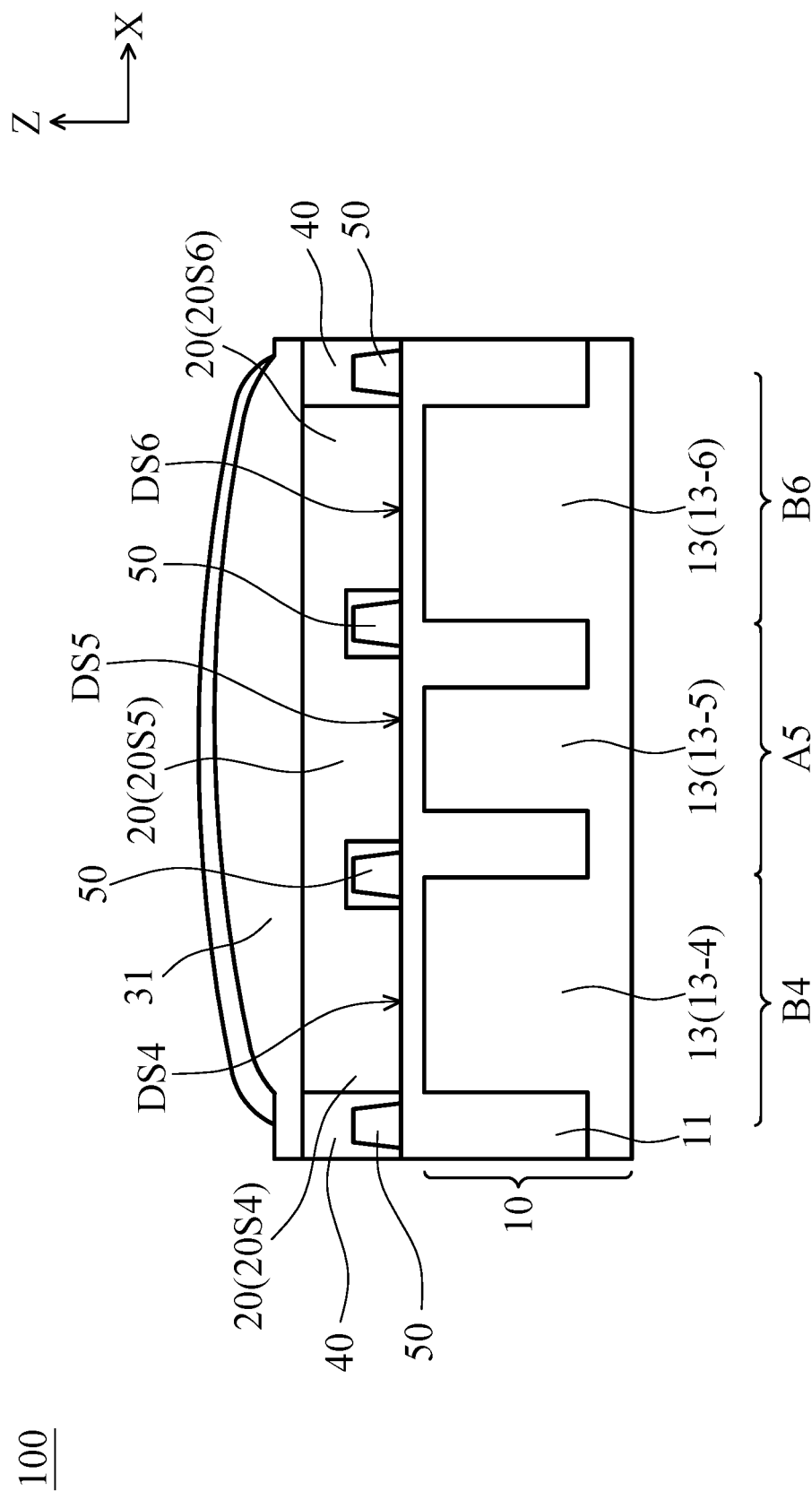
FIG. 2G is a partial cross-sectional view of the solid-state image sensor along line A-A' in FIG. 1 according to another embodiment of the present disclosure.
Figure 2H:
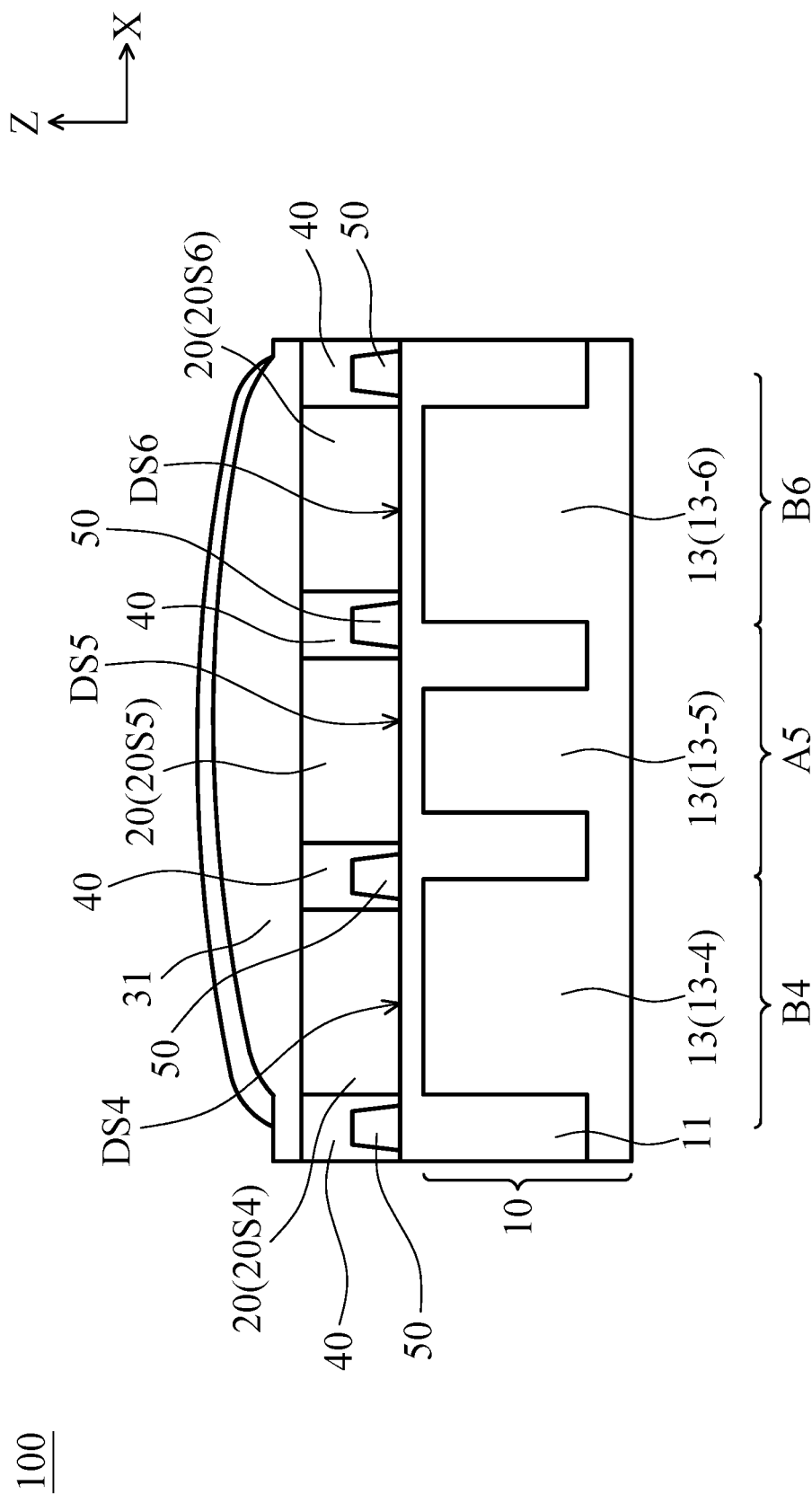
FIG. 2H is a partial cross-sectional view of the solid-state image sensor along line A-A' in FIG. 1 according to another embodiment of the present disclosure.

FIG. 2F to FIG. 2H are partial cross-sectional views of the solid-state image sensor 100 along line A-A' in FIG. 1 according to some other embodiments of the present disclosure. In the embodiments shown in FIG. 2F to FIG. 2H, the bottom surface DS4 of the modulation segment 20S4 (that corresponds to pixel B4), the bottom surface DS5 of the modulation segment 20S5 (that corresponds to pixel A5), and the bottom surface DS6 of the modulation segment 20S6 (that corresponds to pixel 136) may be the same, and the isolation structures 11 (i.e., the shift of the isolation structures 11) may determine the aperture ratio of each pixel, so that the aperture ratios in different pixel regions of the solid-state image sensor 100 may be different from each other as shown in FIG. 1.

As shown in FIG. 2F, the grid structure 40 of the solid-state image sensor 100 may divide the modulation layer 20 into the modulation segments. As shown in FIG. 2G, a portion of the metal grid 50 of the solid-state image sensor 100 may be disposed on the bottom of the grid structure 40, and another portion of the metal grid 50 may divide the modulation layer 20 into the modulation segments. As shown in FIG. 2H, the metal grid 50 of the solid-state image sensor 100 may be disposed on the bottom of the grid structure 40, and both the grid structure 40 and the metal grid 50 may divide the modulation layer 20 into the modulation segments.

Figure 2I:
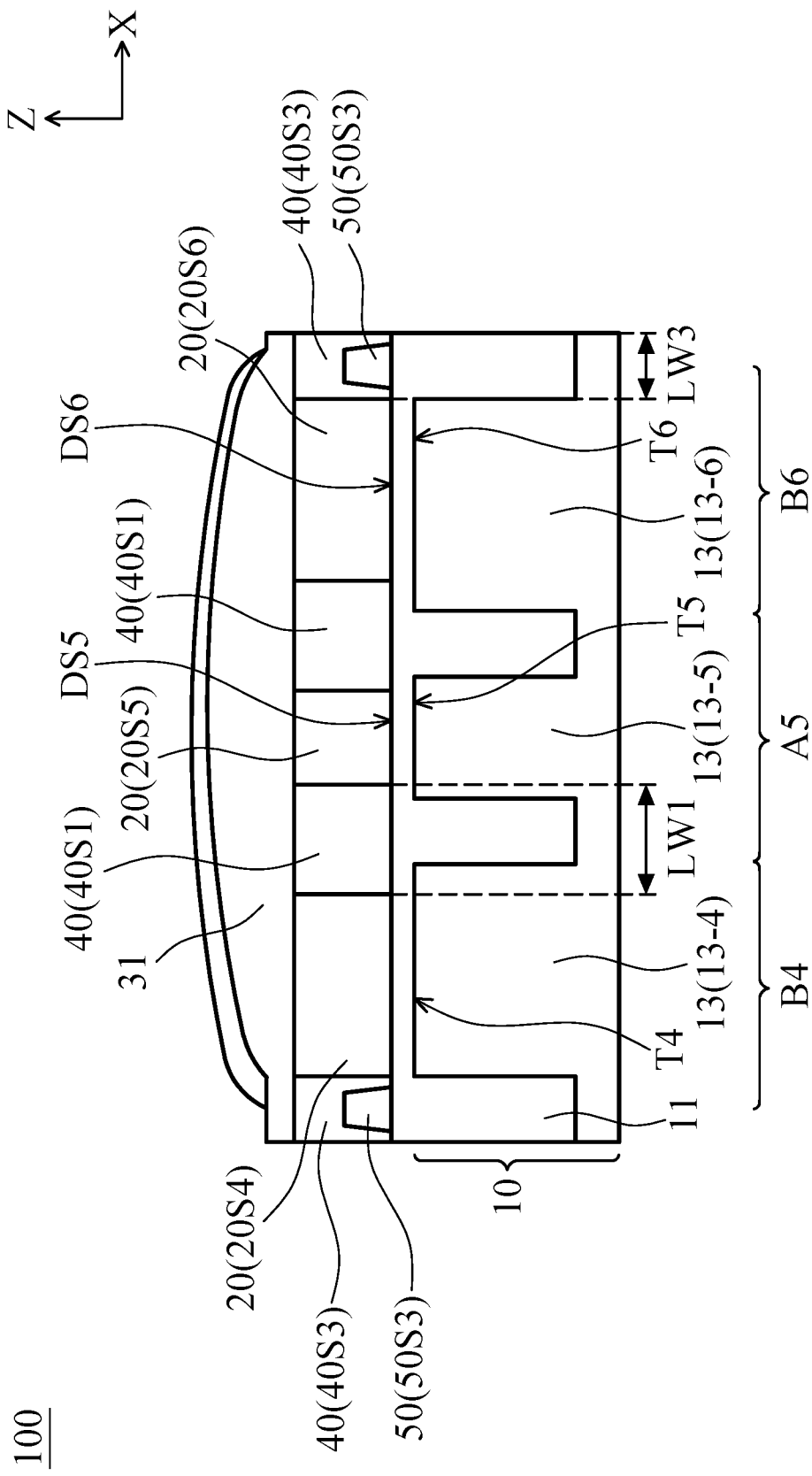
FIG. 2I is a partial cross-sectional view of the solid-state image sensor along line A-A' in FIG. 1 according to another embodiment of the present disclosure.

FIG. 2I is a partial cross-sectional view of the solid-state image sensor 100 along line A-A' in FIG. 1 according to another embodiment of the present disclosure. The solid-state image sensor 100 shown in FIG. 2I is similar to the solid-state image sensor 100 shown in FIG. 2A and FIG. 2E. That is, the grid structure 40 between the modulation segment 20S5 and the modulation segment 20S4 (or the modulation segment 20S6) may have a grid width LW1 (i.e., the grid structure 40S1 shown in FIG. 2I), the grid structure 40 surrounding the pixel array PA (the modulation segment 20S4 and the modulation segment 20S6) may have a grid width LW3 (i.e., the grid structure 40S3 shown in FIG. 2I), and the grid width LW1 is greater than the grid width LW3, so that the bottom area DS5 of the modulation segment 20S5 (that corresponds to the photoelectric conversion element 13-5) is smaller than the bottom area DS6 (or DS4) of the modulation segment 20S6 (or 20S4) (that corresponds to photoelectric conversion element 13-6 (or 13-4)). Moreover, the isolation. structures 11 may shift, so that the top area T5 of the photoelectric conversion element 13-5 that corresponds to pixel A5 may be smaller than the top area T4 of the photoelectric conversion element 13-4 that corresponds to pixel B4 or the top area T6 of the photoelectric conversion element 13-6 that corresponds to pixel B6.

Therefore, the isolation structures 11 and the grid structure 40 may determine the aperture ratio of each pixel, so that the aperture ratios in different pixel regions of the solid-state image sensor 100 may be different from each other as shown in FIG. 1. For example, the aperture ratio of pixel A5 is smaller than the aperture ratio of pixel B4 or pixel B6, and light intensity received by the photoelectric conversion element 13-4, the photoelectric conversion element 13-5, and the photoelectric conversion element 13-6 may be more uniform.

Figure 2J:
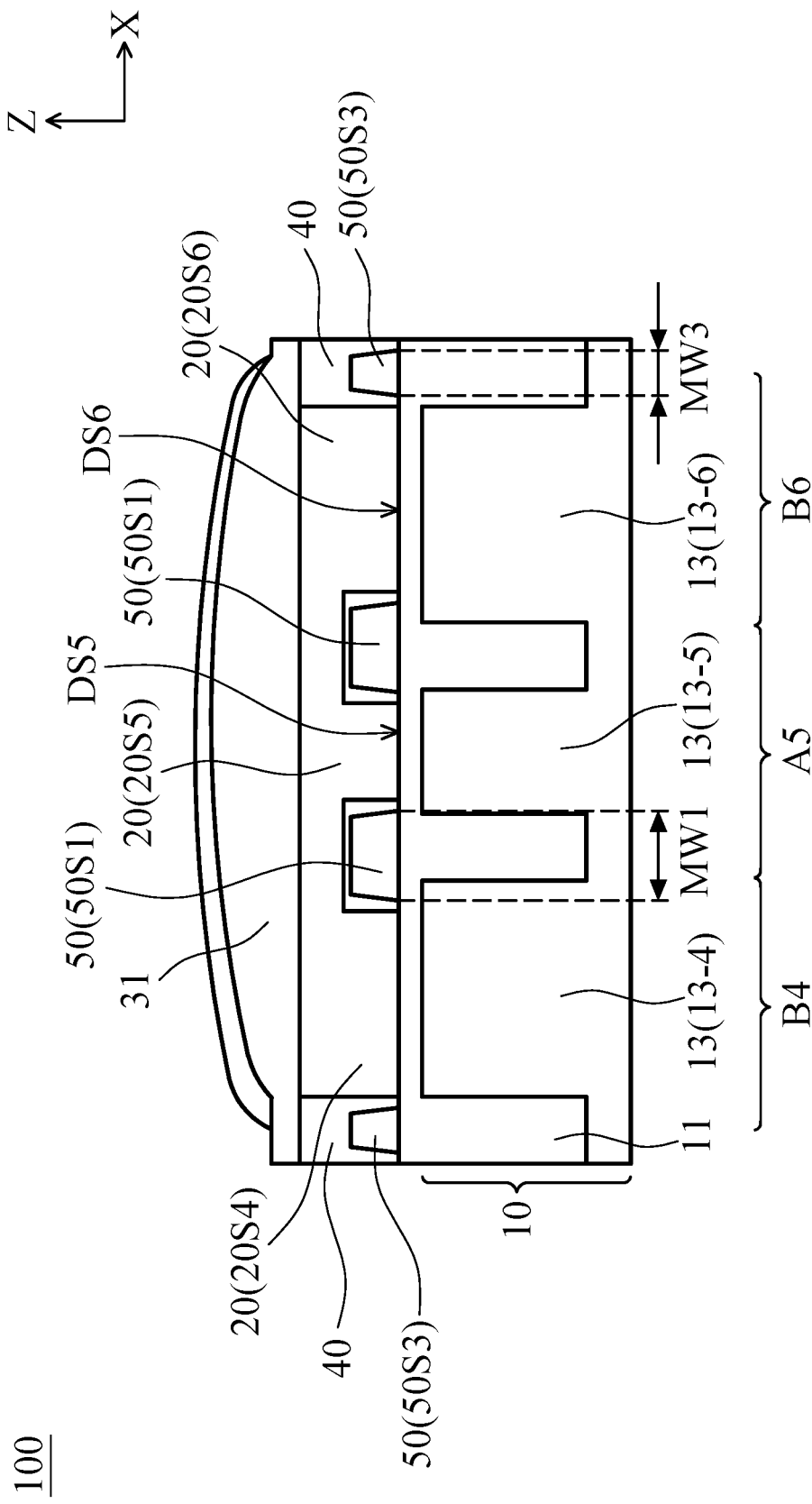
FIG. 2J is a partial cross-sectional view of the solid-state image sensor along line A-A' in FIG. 1 according to another embodiment of the present disclosure.

FIG. 2J is a partial cross-sectional view of the solid-state image sensor 100 along line A-A' in FIG. 1 according to another embodiment of the present disclosure. As shown in FIG. 2J, the isolation structures 11 may shift like the isolation structures 11 shown in FIG. 2I, the metal grid 50 between the modulation segment 20S5 and the modulation segment 20S4 (or the modulation segment 20S6) may have a metal width MW1 (i.e., the metal grid 50S1 shown in FIG. 2J), the metal grid 50 surrounding the pixel array PA (the modulation segment 20S4 and the modulation segment 20S6) may have a metal width MW3 (i.e., the metal grid 50S3 shown in FIG. 2J), and the metal width WW1 is greater than the metal width MW3. In this embodiment, the isolation structures 11 (i.e., the shift of the isolation structures 11) and the metal grid 50 may determine the aperture ratio of each pixel, so that the aperture ratios in different pixel regions of the solid-state image sensor 100 may be different from each other as shown in FIG. 1.

Figure 2K:
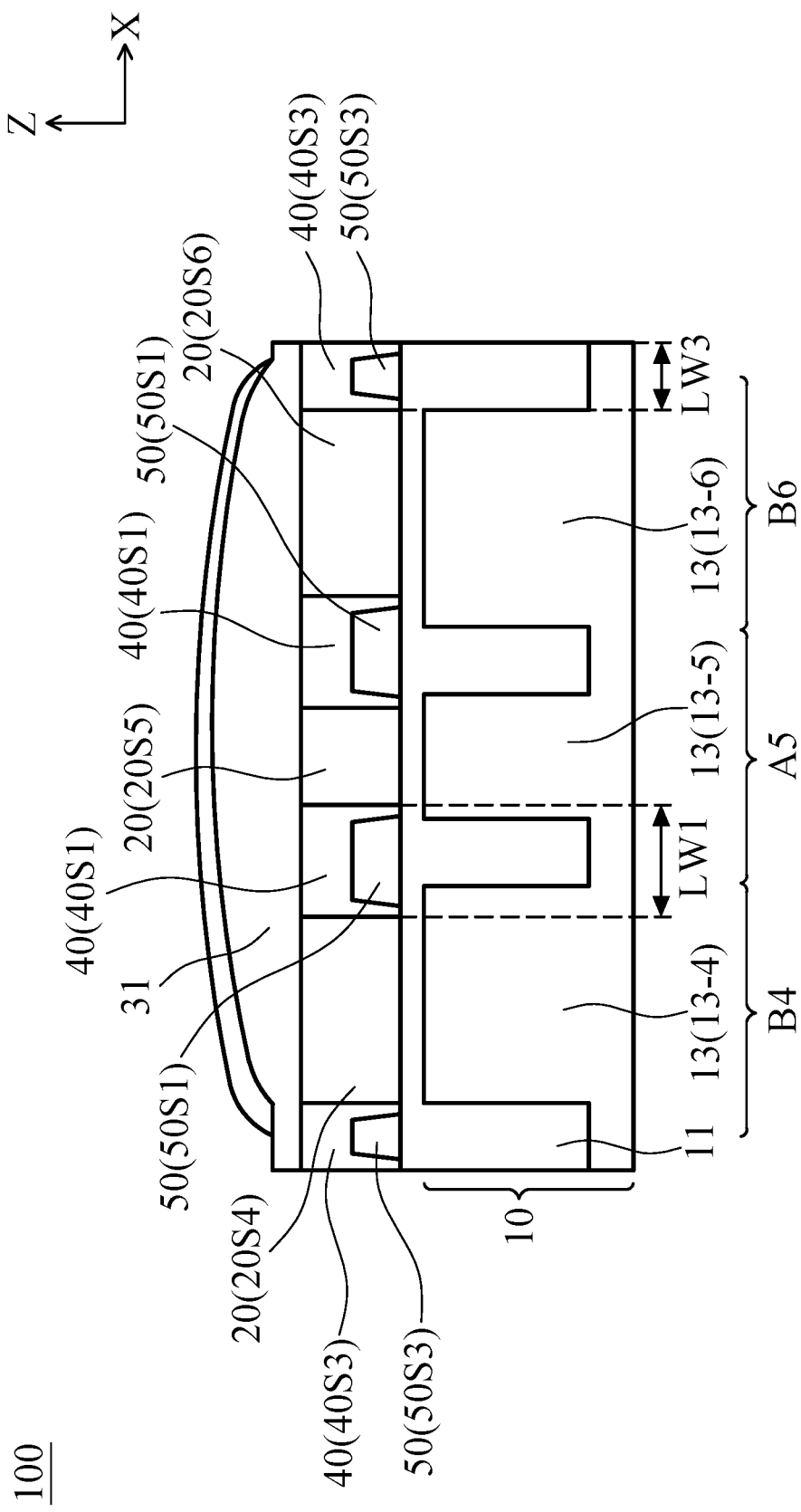
FIG. 2K is a partial cross-sectional view of the solid-state image sensor along line A-A' in FIG. 1 according to another embodiment of the present disclosure.

FIG. 2K is a partial cross-sectional view of the solid-state image sensor 100 along line A-A' in FIG. I according to another embodiment of the present disclosure. As shown in FIG. 2K, the isolation structures 11 may shift like the isolation structures 11 shown in FIG. 2I, the grid width LW1 is greater than the grid width LW3. In this embodiment, the isolation structures 11 (i.e., the shift of the isolation structures 11) and the grid structure 40 (that includes the metal grid 50 disposed on the bottom) may determine the aperture ratio of each pixel, so that the aperture ratios in different pixel regions of the solid-state image sensor 100 may be different from each other as shown in FIG. 1.

Figure 3:
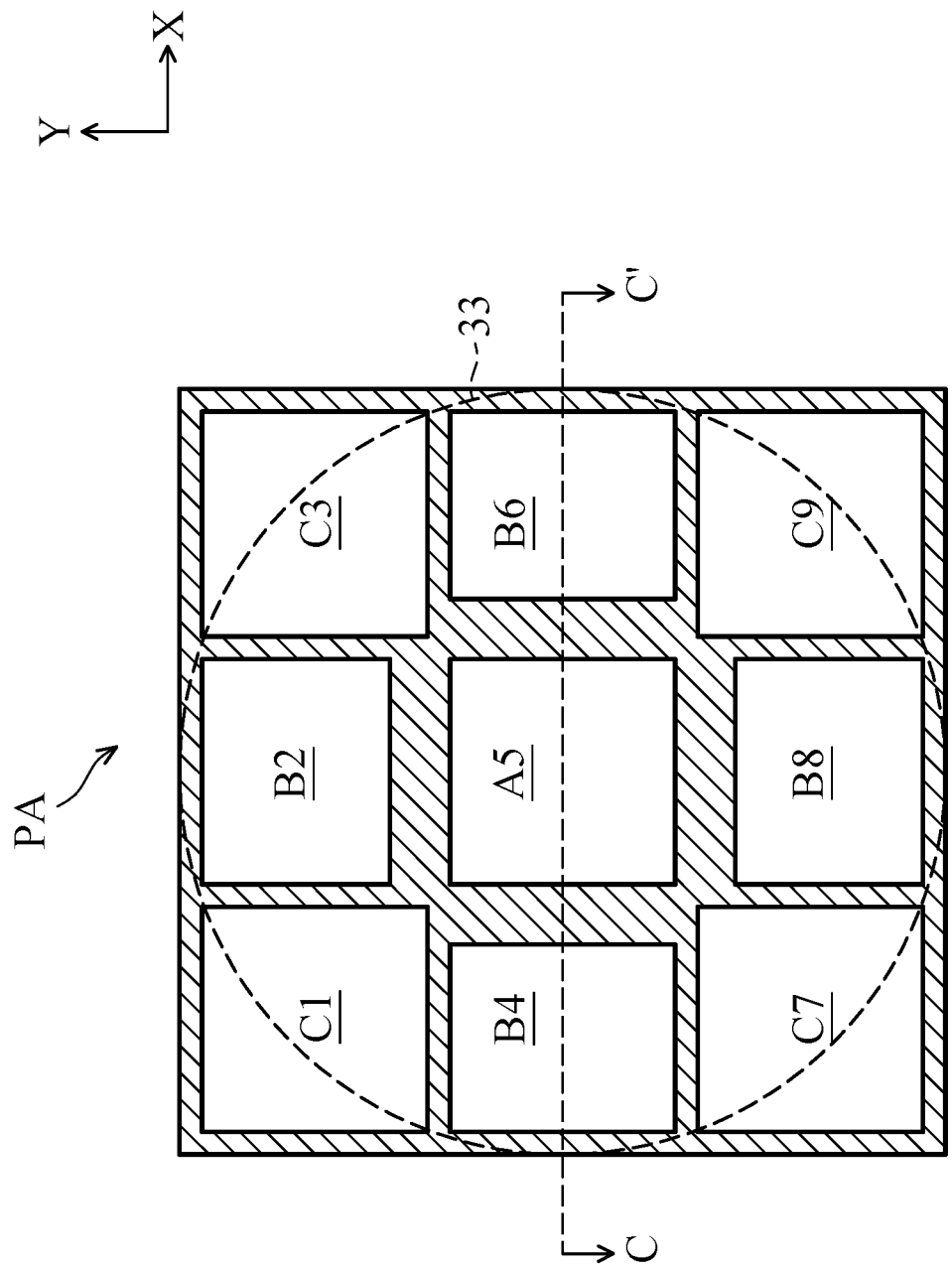
FIG. 3 is a partial top view illustrating the solid-state image sensor in accordance with some embodiments of the present disclosure.
Figure 4A:
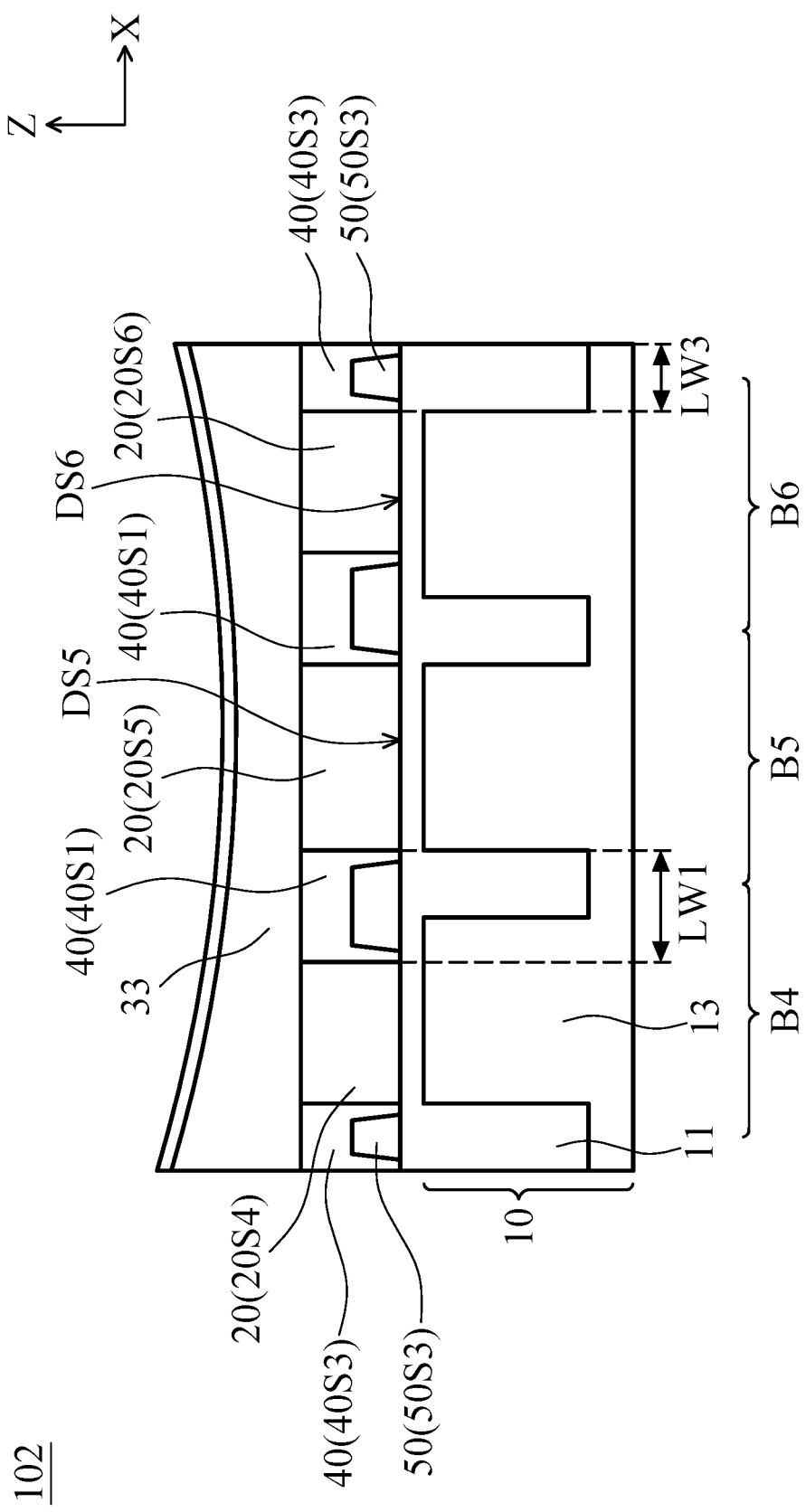
FIG. 4A is a partial cross-sectional view of the solid-state image sensor along line C-C' in FIG. 3.
Figure 4B:
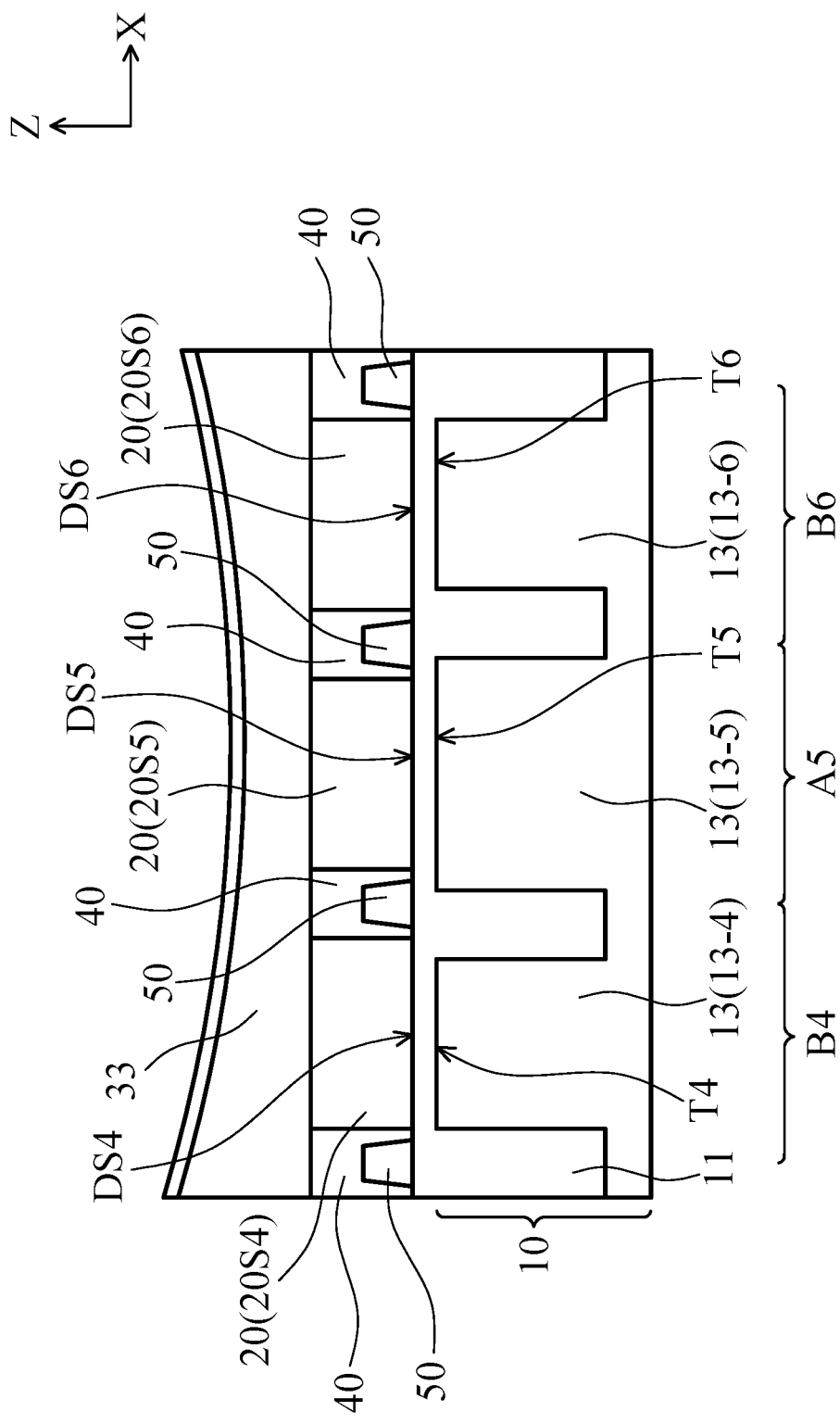
FIG. 4B is a partial cross-sectional view of the solid-state image sensor along line C-C' in FIG. 3 according to another embodiment of the present disclosure.
Figure 4C:
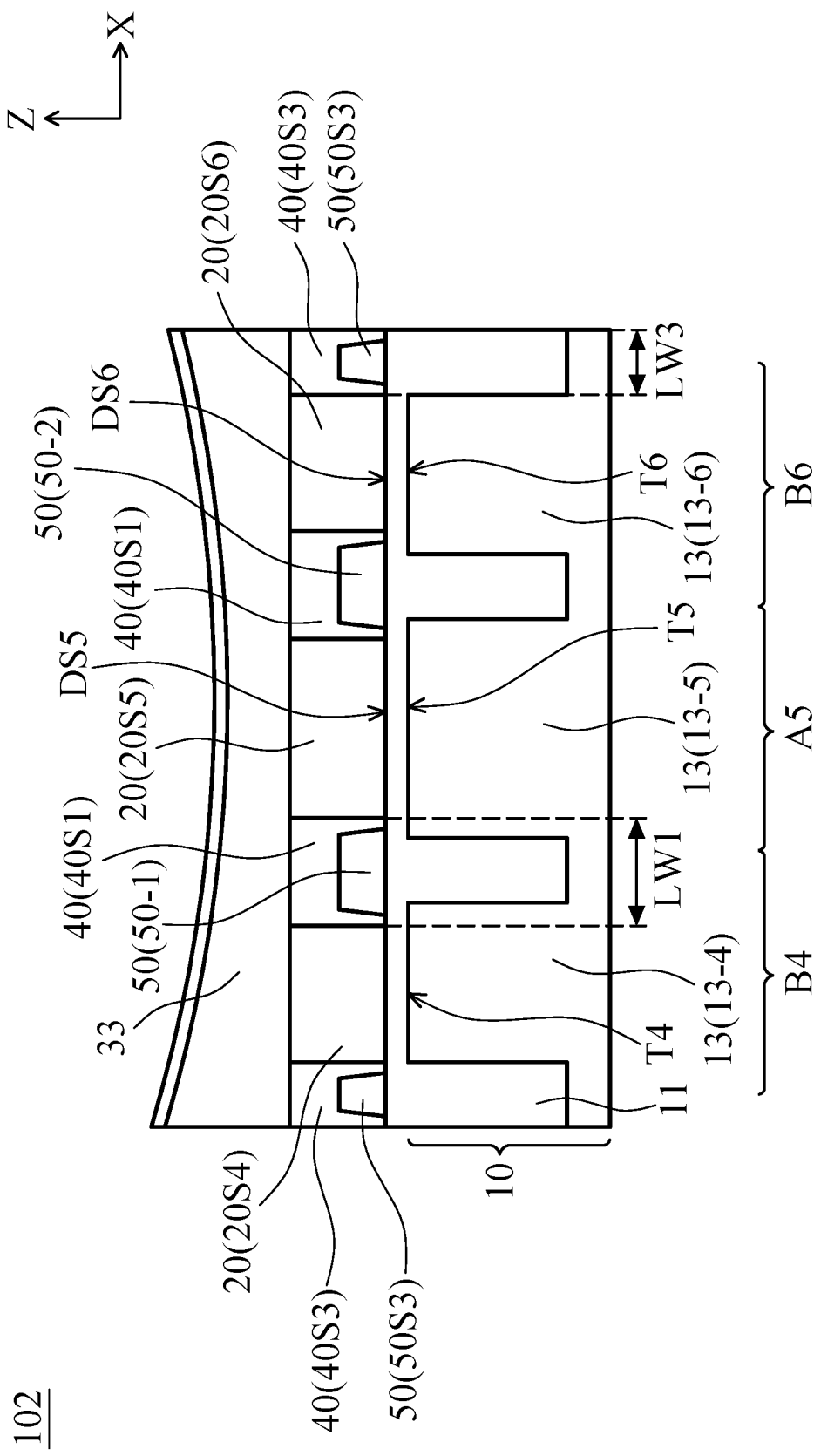
FIG. 4C is a partial cross-sectional view of the solid-state image sensor along line C-C' in FIG. 3 according to another embodiment of the present disclosure.

FIG. 3 is a partial top view illustrating the solid-state image sensor 102 in accordance with some embodiments of the present disclosure. FIG. 4A is a partial cross-sectional view of the solid-state image sensor 102 along line C-C' in FIG. 3 according to one embodiment of the present disclosure. FIG. 4B is a partial cross-sectional view of the solid-state image sensor 102 along line C-C' in FIG. 3 according to another embodiment of the present disclosure. FIG. 4C is a partial cross-sectional view of the solid-state image sensor 102 along line C-C' in FIG. 3 according to another embodiment of the present disclosure. It should be noted that some components of the solid-state image sensor 102 may be omitted in FIG. 3, FIG. 4A and FIG. 4B for the sake of brevity.

Similarly, FIG. 3 merely shows one pixel array PA that includes pixel C1, pixel B2, pixel C3, pixel B4, pixel A5, pixel B6, pixel C7, pixel BM, and pixel C9 that correspond to one light-adjusting structure 33. That is, the pixel array PA may be a 3×3 pixel array that corresponds to one light-adjusting structure 33, arid the pixel array PA may correspond to 3×3 photoelectric conversion elements 13 (shown in FIG. 4A to FIG. 4C).

Referring to FIG. 4A, the solid-state image sensor 102 includes a semiconductor substrate 10 having photoelectric conversion elements 13. In some embodiments, the solid-state image sensor 102 may include isolation structures 11 disposed in the semiconductor substrate 10, and the photoelectric conversion elements 13 may be isolated from each other by the isolation structures 11. The solid-state image sensor 102 also includes a modulation layer 20 disposed above the photoelectric conversion elements 13.

Referring to FIG. 4A, the solid-state image sensor 102 includes a light-adjusting structure 33 disposed on the modulation layer 20, and the light-adjusting structure 33 may correspond to the pixel array PA. That is, the light-adjusting structure 33 may correspond to nine pixels (i.e., pixel C1, pixel B2, pixel C3, pixel B4, pixel A5, pixel B6, pixel C7, pixel B8, and pixel C9). In this embodiment, the light-adjusting structure 33 may be a diverging micro-lens as show in FIG. 4A, and the light-adjusting structure 33 may correspond to the pixel array PA (having nine (3×3 pixels). The incident light will be stronger on the periphery than on the center of the pixel array PA (having nine (3×3 pixels) due to the (diverging) light-adjusting structure 33. For pixel uniformity, the aperture ratio of each pixel may be modified to improve the pixel uniformity.

As shown in FIG. 3, pixel B2, pixel B4, pixel B6, pixel B8 may have the same aperture ratio, and pixel C1, pixel C3, pixel C7, pixel C9 may have the same aperture ratio. In the embodiment shown in FIG. 3, the aperture ratio of pixel A5 is greater than the aperture ratio of pixel B2 (or pixel B4. pixel B6, or pixel B8), and the aperture ratio of pixel C1 (or pixel C3, pixel C7, or pixel C9) is equal to the aperture ratio of pixel A5. For example, as shown in FIG. 4A, the grid width LW1 is greater than the grid width LW3, so that the bottom area DS5 of the modulation segment 20S5 is greater than the bottom area DS6 of the modulation segment 20S6. Moreover, in some embodiments, the bottom area of the modulation segment 20S1 (that corresponds to pixel C1) (not shown in FIG. 4A) may be equal to the bottom area DS5 of the modulation segment 20S5.

In the embodiment shown in FIG. 4A, the grid structure 40 (that includes the metal grid 50 disposed on the bottom) may determine the aperture ratio of each pixel, so that the aperture ratios of pixels may be as shown in FIG. 3. In some other embodiments, the metal grid 50 or the grid structure 40 without the metal grid 50 may also determine the aperture ratio of each pixel, which will not be repeated here.

Referring to FIG. 4B, in this embodiment, the grid structure 40 (with or without the metal grid 50) has a constant width, so that the bottom surface DS4 of the modulation segment 20S4 (that corresponds to pixel B4), the bottom surface DS5 of the modulation segment 20S5 (that corresponds to pixel A5), and the bottom surface DS6 of the modulation segment 20S6 (that corresponds to pixel B6) may be the same. Moreover, the photoelectric conversion elements 13 of the solid-state image sensor 102 may be different from each other duo to the shift of the isolation structures 11. For example, the locations of the isolation structures 11 may be adjusted to form different photoelectric conversion elements 13.

As shown in FIG. 4B, the isolation structures 11 may shift, so that the top area T5 of the photoelectric conversion element 13-5 that corresponds to pixel A5 may be greater than the top area T4 of the photoelectric conversion element 13-4 that corresponds to pixel B4 or the top area T6 of the photoelectric conversion element 13-6 that corresponds to pixel B6. Therefore, light intensity received by the photoelectric conversion element 13-4. the photoelectric conversion element 13-5, and the photoelectric conversion element 13-6 may be more uniform. Moreover, in some embodiments, the top area of the photoelectric conversion element that corresponds to pixel C1 (not shown in FIG. 4B) may be equal to the top area T5 of the photoelectric conversion element 13-5 that corresponds to pixel A5.

In the embodiment shown in FIG. 4B, the isolation structures 11 (i.e., the shift of the isolation structures 11) may determine the aperture ratio of each pixel, so that the aperture ratios of pixels may be as shown in FIG. 3.

Referring to FIG. 4C, the grid structure 40 (with or without the metal grid 50 disposed on the bottom) may have a grid width LW1 and a grid width and the grid width LW1 is greater than the grid width LW3, so that the bottom area DS5 of the modulation segment 20S5 that corresponds to pixel A5 is greater than the bottom area DS6 of the modulation segment 20S5 that corresponds to pixel B6; the isolation structures 11 may shift, so that the top area T5 of the photoelectric conversion element 13-5 that corresponds to pixel A5 may be greater than the top area T4 of the photoelectric conversion element 13-4 that corresponds to pixel B4 or the top area T6 of the photoelectric conversion element 13-6 that corresponds to pixel B6.

In the embodiment shown in FIG. 4C, the isolation structures 11 (the shift of the isolation structures 11) and the grid structure 40 (with or without the metal grid 50) may determine the aperture ratio of each pixel, so that the aperture ratios of pixels may be as shown in FIG. 3.

Figure 5:
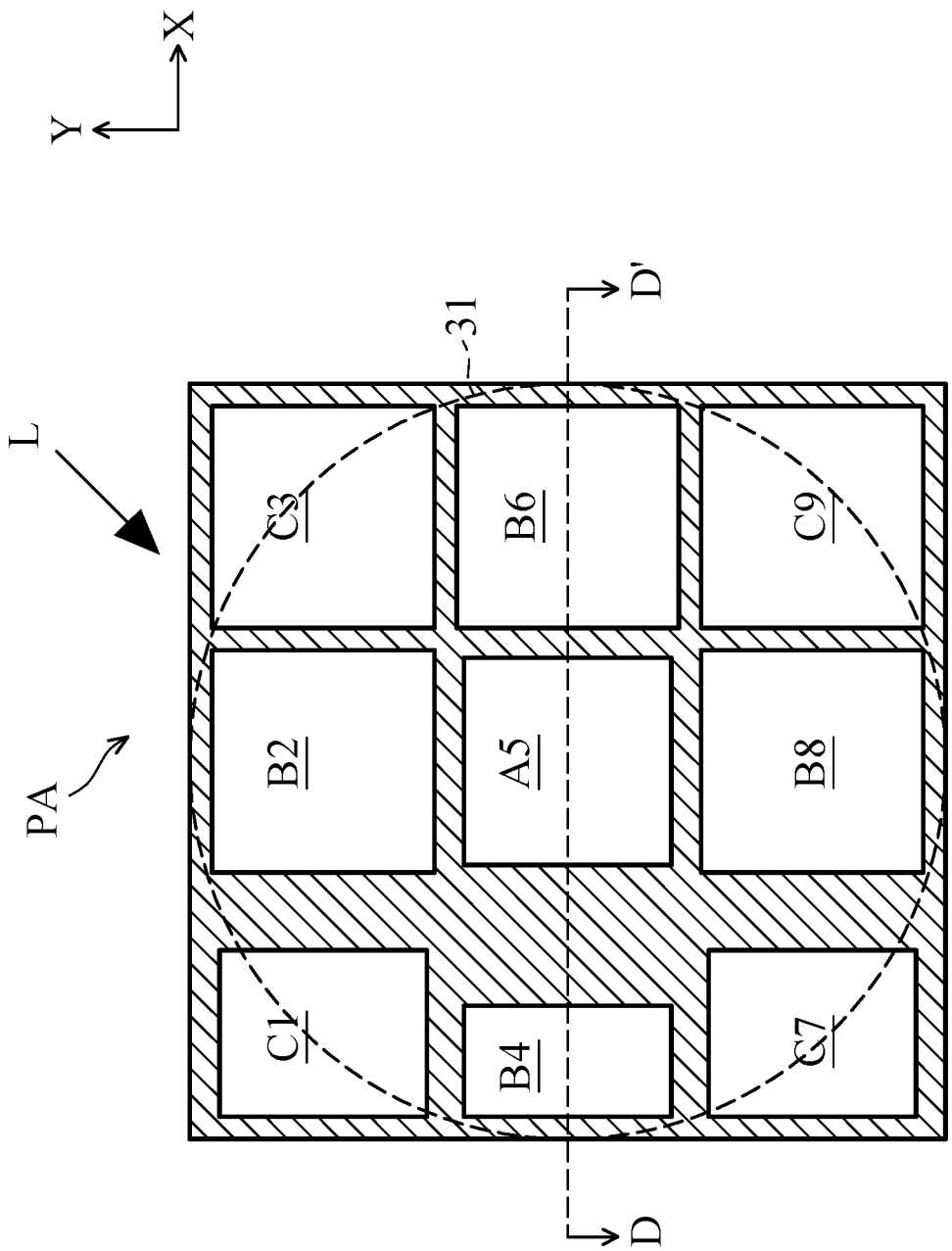
FIG. 5 is a partial top view illustrating the solid-state image sensor in accordance with sonic embodiments of the present disclosure.
Figure 6A:
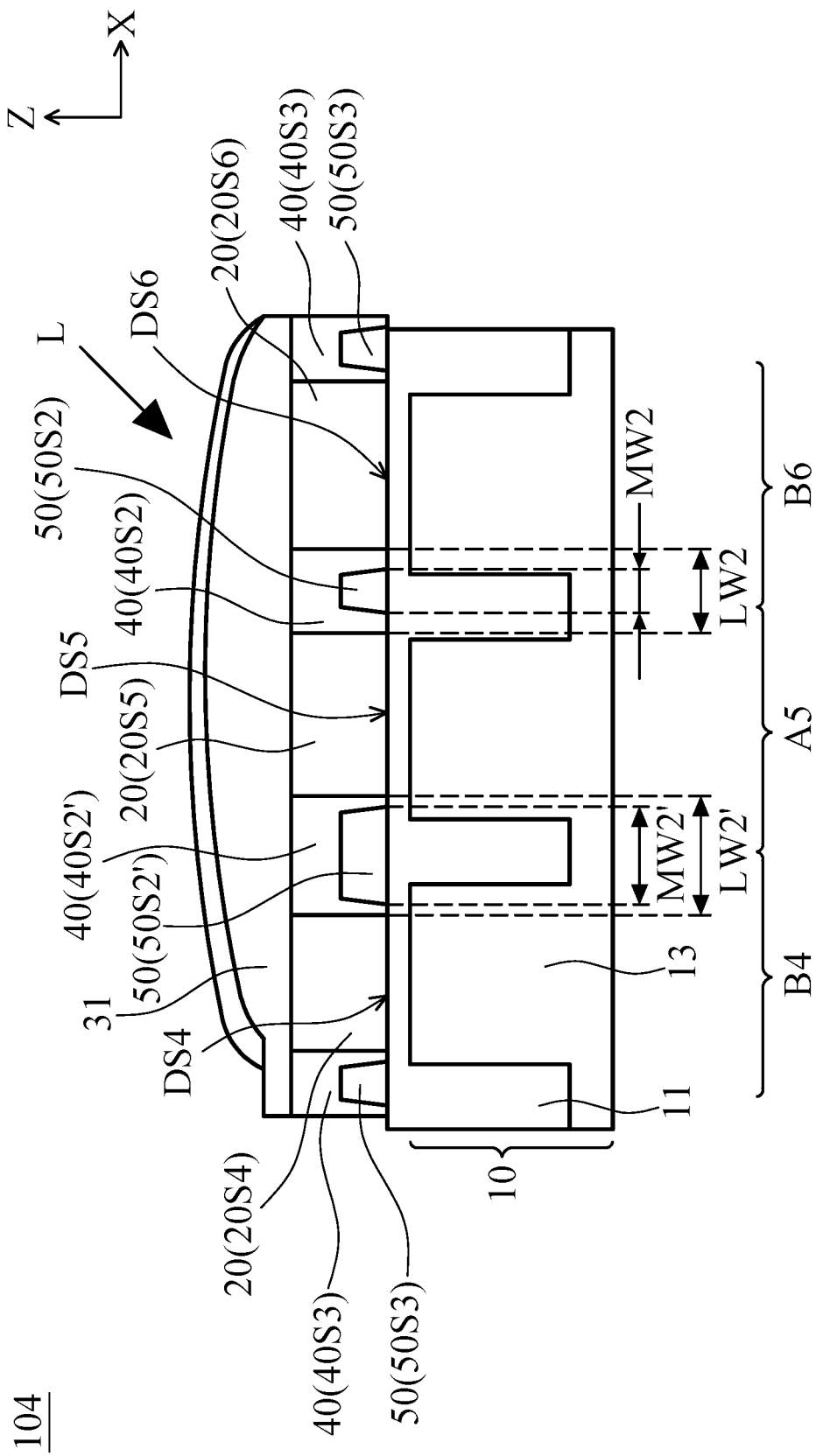
FIG. 6A is a partial cross-sectional view of the solid-state image sensor along line D-D' in FIG. 5.
Figure 6B:
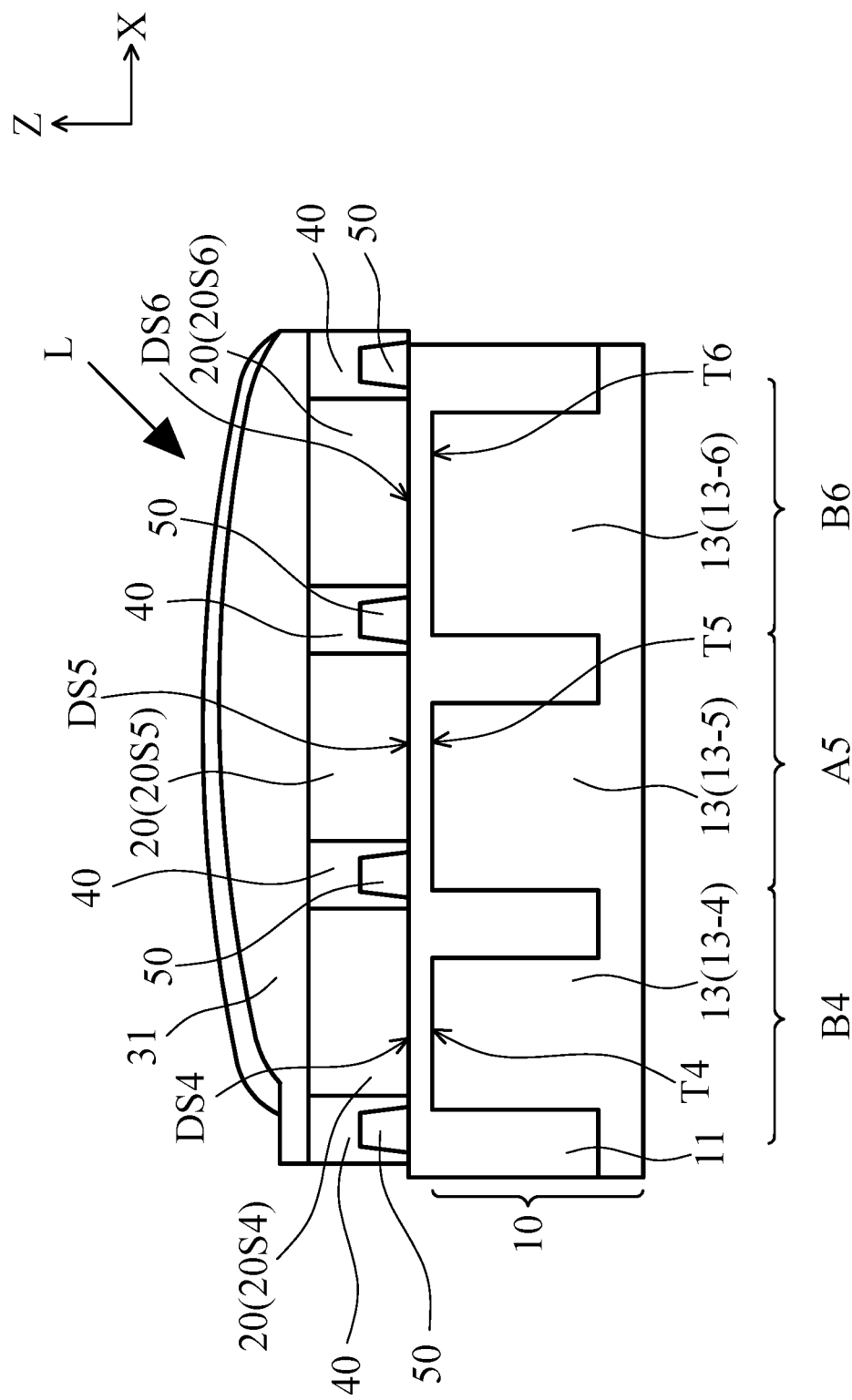
FIG. 6B is a partial cross-sectional view of the solid-state image sensor along line D-D' in FIG. 5 according to another embodiment of the present disclosure.
Figure 6C:
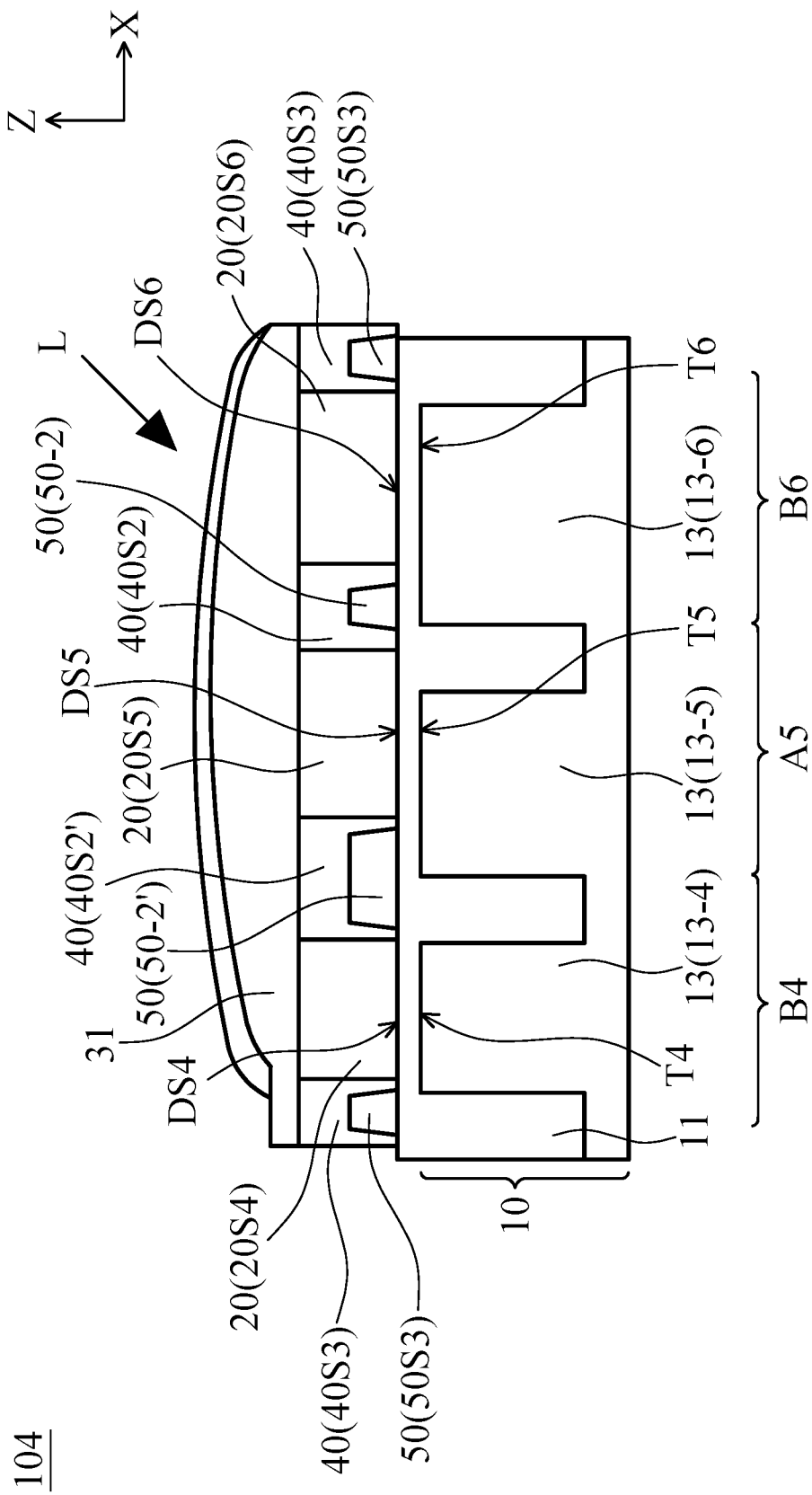
FIG. 6C is a partial cross-sectional view of the solid-state image sensor along line D-D' in FIG. 5 according to another embodiment of the present disclosure.

FIG. 5 is a partial top view illustrating the solid-state image sensor 104 in accordance with some embodiments of the present disclosure. In the embodiment shown in FIG. 5, the light source may be placed on the right side of the pixel array PA, so that the incident light may come from the right side of the pixel array PA. In some other embodiments, the light source may be placed on the left side of the pixel array PA, so that the incident light may come from the left side of the pixel array PA. FIG. 6A is a partial cross-sectional view of the solid-state image sensor 104 along line D-D' in FIG. S according to one embodiment of the present disclosure. FIG. 6B is a partial cross-sectional view of the solid-state image sensor 104 along line D-D' in FIG. 5 according to another embodiment of the present disclosure. FIG. 6C is a partial cross-sectional view of the solid-state image sensor 104 along line D-D' in FIG. 5 according to another embodiment of the present disclosure. It should be noted that some components of the solid-state image sensor 104 may be omitted in FIG. 5, FIG. 6A, FIG. 6B, and FIG. 6C for the sake of brevity.

In the embodiment shown in FIG. 5, the incident light will be stronger on the leftmost pixels (e.g., pixel B4) than other pixels (e.g., pixel A5 and/or pixel B6) of the pixel array PA (having nine (3×3) pixels) due to the (converging) light-adjusting structure 31. For pixel uniformity, the aperture ratio of each pixel may be modified to improve the pixel uniformity.

For example, as shown in FIG. 6A, the incident light is from the right side, the arid structure 40 between the modulation segment 20S5 and the modulation segment 20S6 may have a grid width LW2 (i.e., the grid structure 40S2 shown in FIG. 6A) and/or the metal grid 50 between the modulation segment 20S5 and the modulation segment 20S6 may have a metal width MW2 (i.e., the metal grid 50S2 shown in FIG. 6A), the grid structure 40 between the modulation segment 20S5 and the modulation segment 20S4 may have a grid width LW2' (i.e., the grid structure 40S2' shown in FIG. 6A) and/or the metal grid 50 between the modulation segment 20S5 and the modulation segment 20S4 may have a metal width MW2' (i.e., the metal grid 50S2' shown in FIG. 6A), the grid width LW2' is greater than the grid width LW2 and/or the metal width MW2' is greater than the metal width MW2, so that the bottom area DS4 of the modulation segment 20S4 that corresponds to pixel B4 is smaller than the bottom area DS5 of the modulation segment 20S5 that corresponds to pixel A5, and the bottom area DS5 of the modulation segment 20S5 that corresponds to pixel A5 is smaller than the bottom area DS6 of the modulation segment 20S6 that corresponds to pixel B6.

That is, the grid structure 40 and/or the metal grid 50 may determine the aperture ratio of each pixel, so that the aperture ratio of pixel B6 (i.e., the pixel on the right side of pixel A5) is greater than the aperture ratio of pixel A5, and the aperture ratio of pixel A5 is greater than the aperture ratio of pixel B4 (i.e., the pixel on the left side of pixel A5) as shown in FIG. 5.

Referring to FIG. 6B, in this embodiment, the bottom surface DS4 of the modulation segment 20S4 (that corresponds to pixel B4), the bottom surface DS5 of the modulation segment 20S5 (that corresponds to pixel A5), and the bottom surface DS6 of the modulation segment 20S6 (that corresponds to pixel B6) may be the same, and the isolation structures 11 may shift to determine the aperture ratio of each pixel.

As shown in FIG. 6B, the top area T4 of the photoelectric conversion element 13-4 that corresponds to pixel B4 may be smaller than the top area T5 of the photoelectric conversion element 13-5 that corresponds to pixel A5, and the top area T5 of the photoelectric conversion element 13-5 that corresponds to pixel A5 may be smaller than the top area 16 of the photoelectric conversion element 13-6 that corresponds to pixel B6, so that the aperture ratios of pixels may be as shown in FIG. 5.

Referring to FIG. 6C, in this embodiment, the grid structure 40 (with or without the metal grid 50) may be adjusted, so that the bottom area DS4 of the modulation segment 20S4 that corresponds to pixel B4 is smaller than the bottom area DS5 of the modulation segment 20S5 that corresponds to pixel A5, and the bottom area DS5 of the modulation segment 20S5 that corresponds to pixel A5 is smaller than the bottom area DS6 of the modulation segment 20S6 that corresponds to pixel B6. Moreover, the isolation structures 11 may shift, so that top area T4 of the photoelectric conversion element 13-4 that corresponds to pixel B4 is smaller than the top area T5 of the photoelectric conversion element 13-5 that corresponds to pixel A5, and the top area T5 of the photoelectric conversion element 13-5 that corresponds to pixel A5 is smaller than the top area T6 of the photoelectric conversion element 13-6 that corresponds to pixel B6.

In this embodiment, the isolation structures 11 and the grid structure 40 (with or without the metal grid 50) may determine the aperture ratio of each pixel, so that the aperture ratios of pixels may be as shown in FIG. 5.

Figure 7:
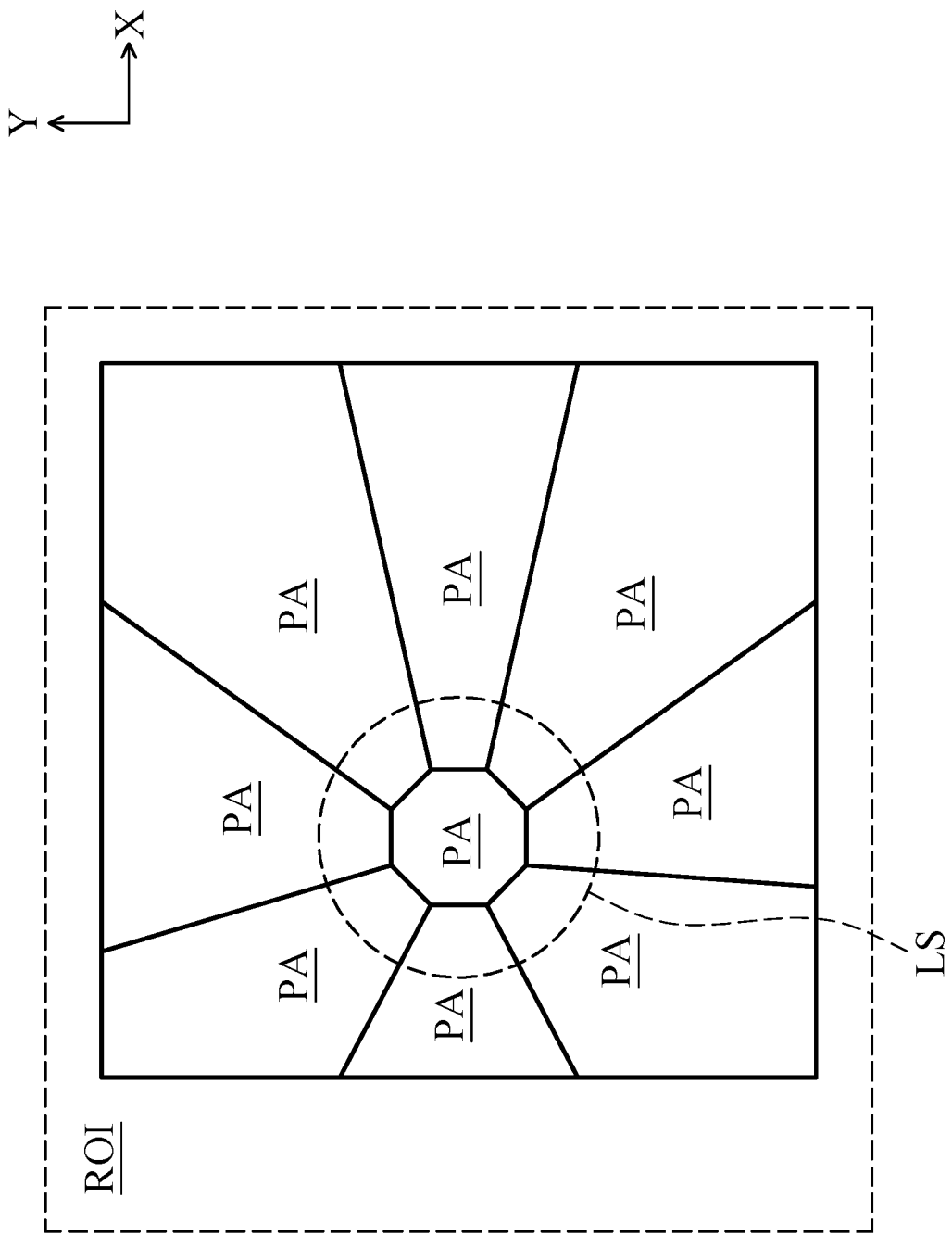
FIG. 7 is a region of interest ROI of an image in accordance with one embodiment of the present disclosure.

FIG. 7 is a region of interest ROI of an image in accordance with one embodiment of the present disclosure. Referring to FIG. 7, the region of interest ROI may be formed of nine pixel arrays PA, and each pixel array PA may have nine (3×3) pixels (or more) as shown in the foregoing embodiments. As shown in FIG. 7, the pixel arrays PA may be formed into irregular shapes. For example, the shape of each pixel array PA may be modified depending on the position of the light spot LS.

When the pixel array PA is used for phase detection auto focus (PDAF), pixel binning may be used in the pixel array PA. In some embodiments, under low luminous intensity, three adjacent pixels may be binning. PDAF function may be performed by comparing the signal strength of left pixel to the signal strength of right pixel or comparing the signal strength of top pixel to the signal strength of bottom pixel. For top/bottom condition, the top can use binning about pixel C1, pixel B2 and pixel C3, and the bottom can use binning about pixel C7, pixel B8 and pixel C9. For left/right condition, the left can use binning about pixel C1, pixel B4 and pixel C7, and the right can use binning about pixel C3, pixel B6 and pixel C9. In some embodiments, under mid luminous intensity, the PDAF function may be performed by comparing the signal strength of pixel B2 to the signal strength of pixel B8 (top/bottom) or comparing the signal strength of pixel B4 to the signal strength of pixel B6 (left/right).

Figure 8:
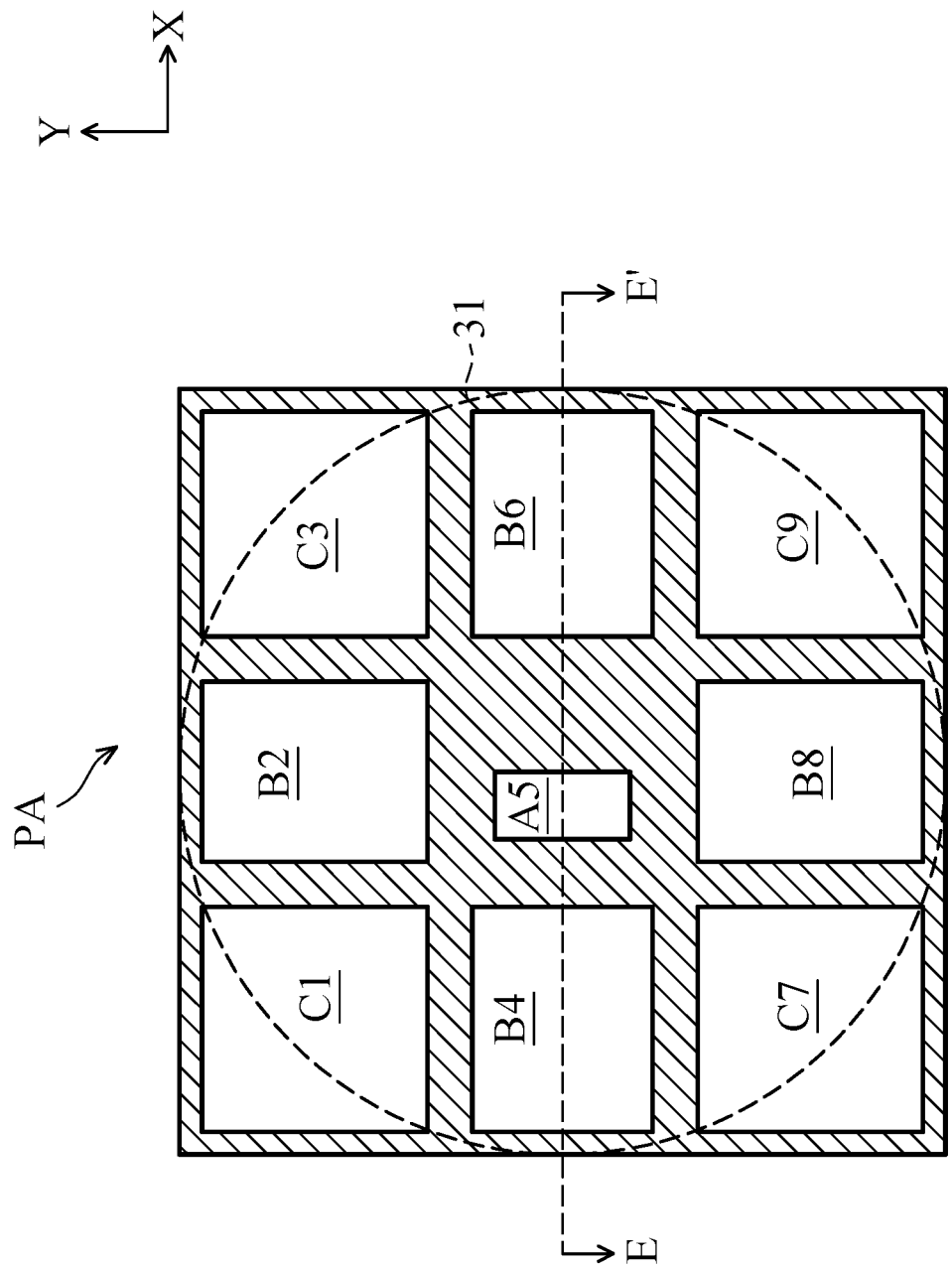
FIG. 8 is a partial top view illustrating the solid-state image sensor in accordance with some embodiments of the present disclosure.
Figure 9:
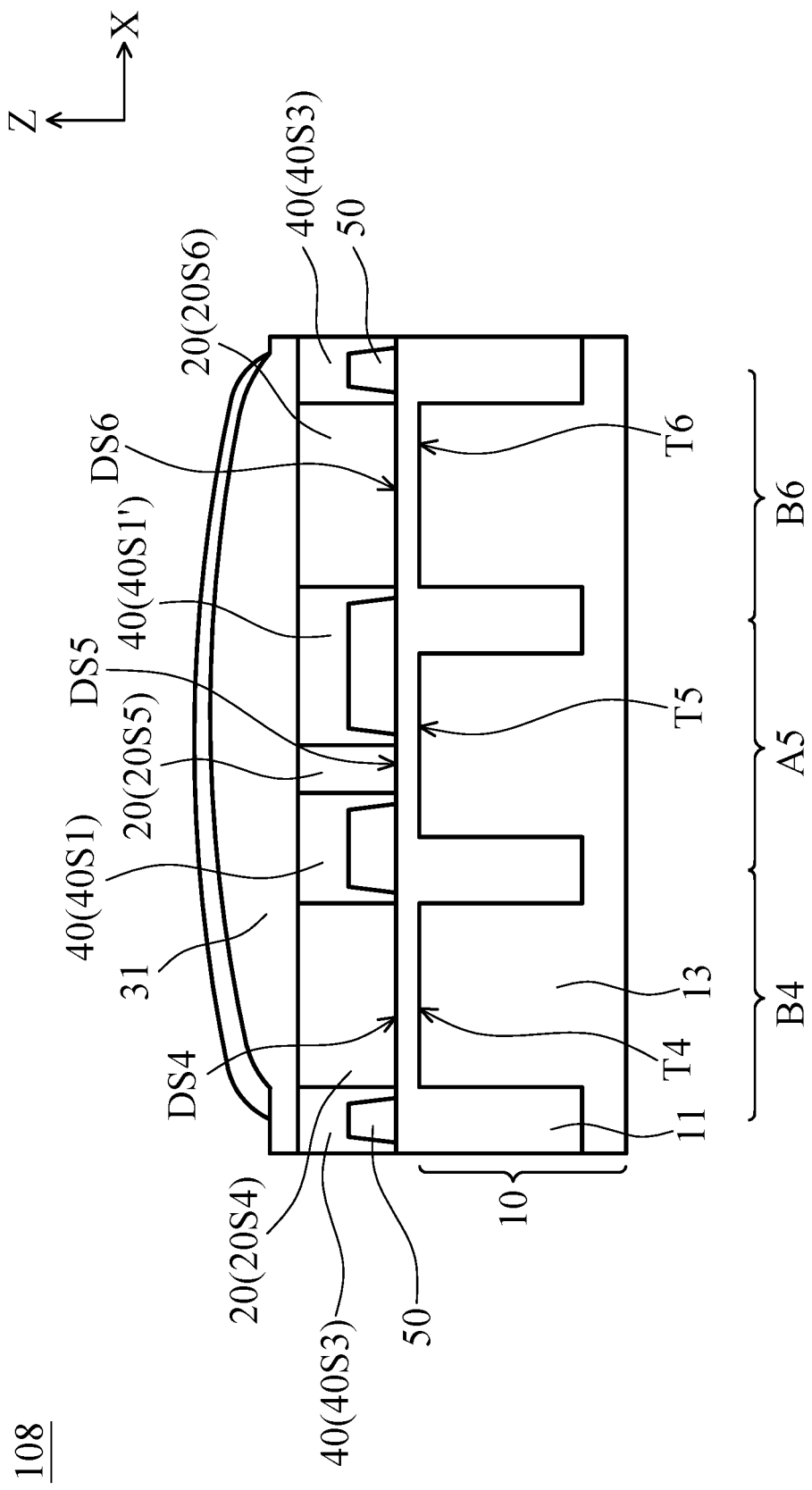
FIG. 9 is a partial cross-sectional view of the solid-state image sensor along line E-E' in FIG. 8.

FIG. 8 is a partial top view illustrating the solid-state image sensor 108 in accordance with some embodiments of the present disclosure. FIG. 9 is a partial cross-sectional view of the solid-state image sensor 108 along line E-E' in FIG. 8. It should be noted that some components of the solid-state image sensor 108 may be omitted in FIG. 8 and FIG. 9 for the sake of brevity.

In sonic embodiments, the pixel array PA may be designed to be half-shielding for reducing focusing time for PDAF function. As shown in FIG. 8 and FIG. 9, the grid structure 40 (that includes the metal grid 50 disposed on the bottom) (e.g., the grid structure 40S1 and 40S1') between the modulation segment 20S5 (that corresponds to pixel A5) and the modulation segment 20S6 (that corresponds to pixel B6) or the modulation segment 20S4 (that corresponds to pixel B4) may be modified, so that the bottom area DS5 of the modulation segment 20S5 is smaller than the bottom area DS6 (or DS4) of the modulation segment 20S6 (or 20S4). For example, the ratio of the bottom area DS5 of the modulation segment 20S5 to the bottom area DS6 (or DS4) of the modulation segment 20S6 (or 20S4) may be smaller than 0.5. In this embodiment, the modulation segment 20S5 may be filled with green material. In some other embodiment, the modulation segment 20S5 may be filled with yellow or transparent material for sensitivity improvement at low light environment.

Figure 10:
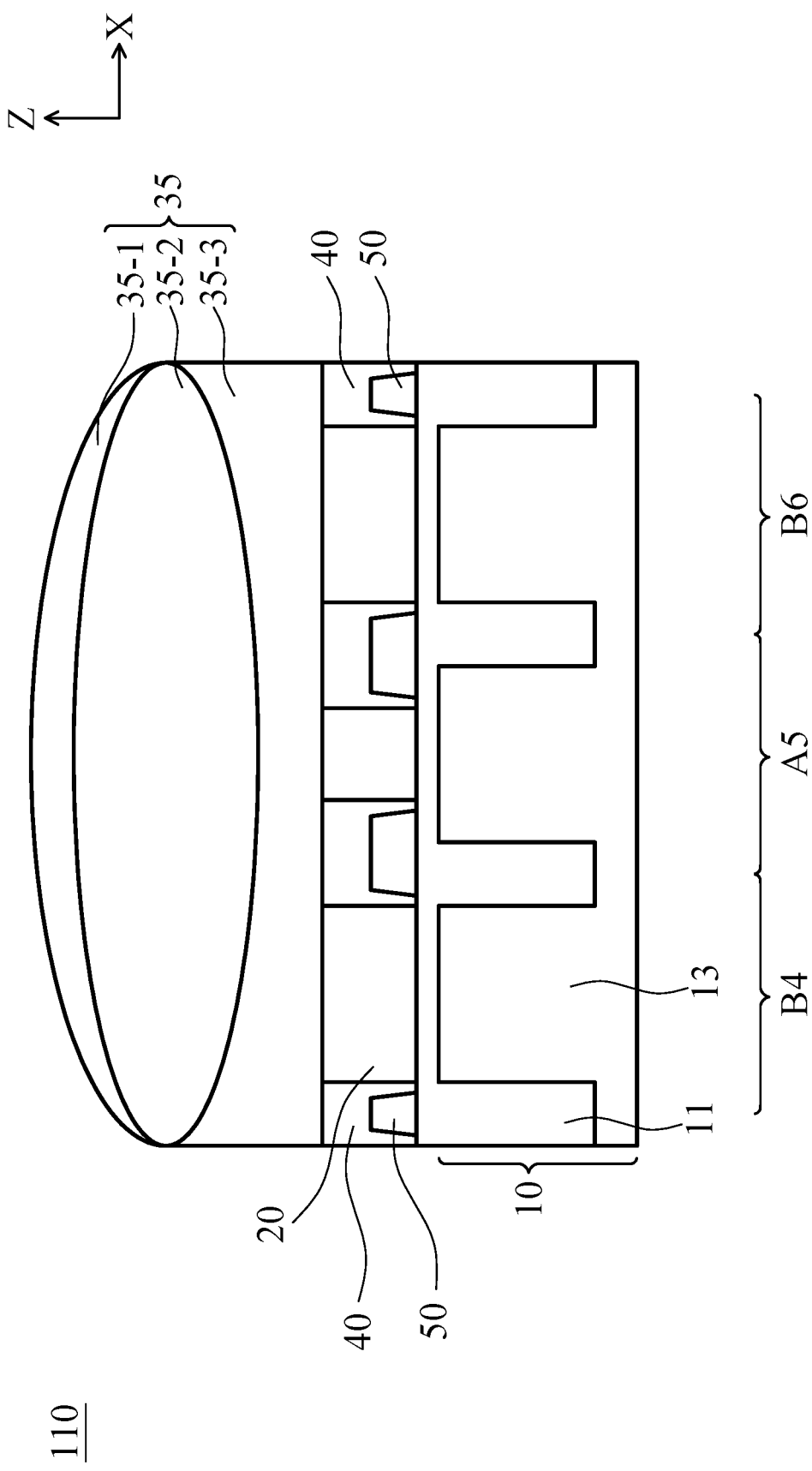
FIG. 10 is a partial cross-sectional view illustrating the solid-state image sensor in accordance with some other embodiments of the present disclosure.

FIG. 10 is a partial cross-sectional view illustrating the solid-state image sensor 110 in accordance with some other embodiments of the present disclosure. It should be noted that some components of the solid-state image sensor 110 may be omitted in FIG. 10 for the sake of brevity.

In the forgoing embodiments, the light-adjusting structure may be a spherical micro-lens (e.g., the light-adjusting structure 31 shown in FIG. 2A-2K, FIG. 6A-6C, FIG. 9) or a concave micro-lens (e.g., the light-adjusting structure 33 shown in FIG. 4A-4C). In some other embodiment, the light-adjusting structure may be an asymmetric sphere micro-lens or not a micro-lens. As shown in FIG. 10, the light-adjusting structure 35 of the solid-state image sensor 110 may be a multi-layer structure. In some embodiments, the light-adjusting structure 35 may include a sub-layer 35-3 disposed on the modulation layer 20, a sub-layer 35-2 disposed on sub-layer 35-3, and a sub-layer 35-1 disposed on sub-layer 35-2. In some embodiments, the refractive index of the sub-layer 35-3 may be greater than the refractive index of the sub-layer 35-2, and the refractive index of the sub-layer 35-2 may be greater than the refractive index of the sub-layer 35-1. The number of sub-layers of the light-adjusting structure 35 may be adjusted depending on actual need.

Figure 11:
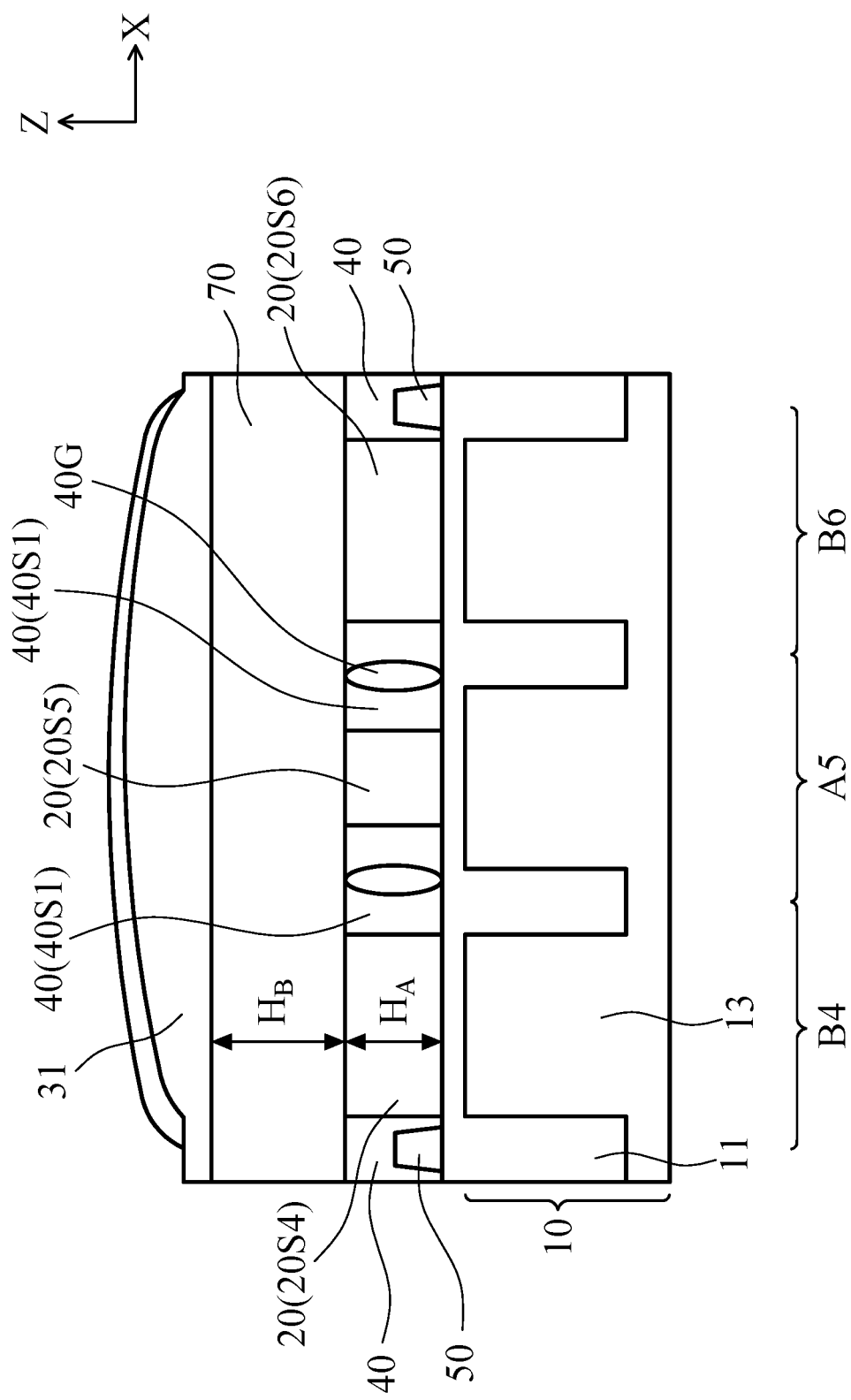
FIG. 11 is a partial cross-sectional view illustrating the solid-state image sensor in accordance with some other embodiments of the present disclosure.

FIG. 11 is a partial cross-sectional view illustrating the solid-state image sensor 112 in accordance with some other embodiments of the present disclosure. It should be noted that some components of the solid-state image sensor 112 may be omitted in FIG. 11 for the sake of brevity.

Referring to FIG. 11, the solid-state image sensor 112 may have a low refractive index hybrid scheme. That is, the solid-state image sensor 112 may include a color filter layer 70 disposed on the modulation layer 20 to filter light, and the refractive index of the grid structure 40 may be lower than the refractive index of the modulation layer 20 to separate light. Therefore, the stacked modulation layer 20 and color filter layer 70 may improve the channel separation of the modulation segment 20S5 (and the modulation segment 20S4 and the modulation segment 20S6).

In some embodiments, the solid-state image sensor 112 may further include an air gap 40G disposed in the grid structure 40. In particular, the air gap 40G may be disposed in the grid structure 40 that corresponds to the space between the first pixel region and the second pixel region (e.g., in the grid structure 40S1 as shown in FIG. 11) and the space between the second pixel region and the third pixel region.

In some embodiments, the thickness HA of the modulation layer 20 and the thickness HB of the color filter layer 70 may be different. For example, the ratio of the thickness HA of the modulation layer 20 to the thickness HB of the color filter layer 70 may be between about 0.25 and about 1.

Figure 12:
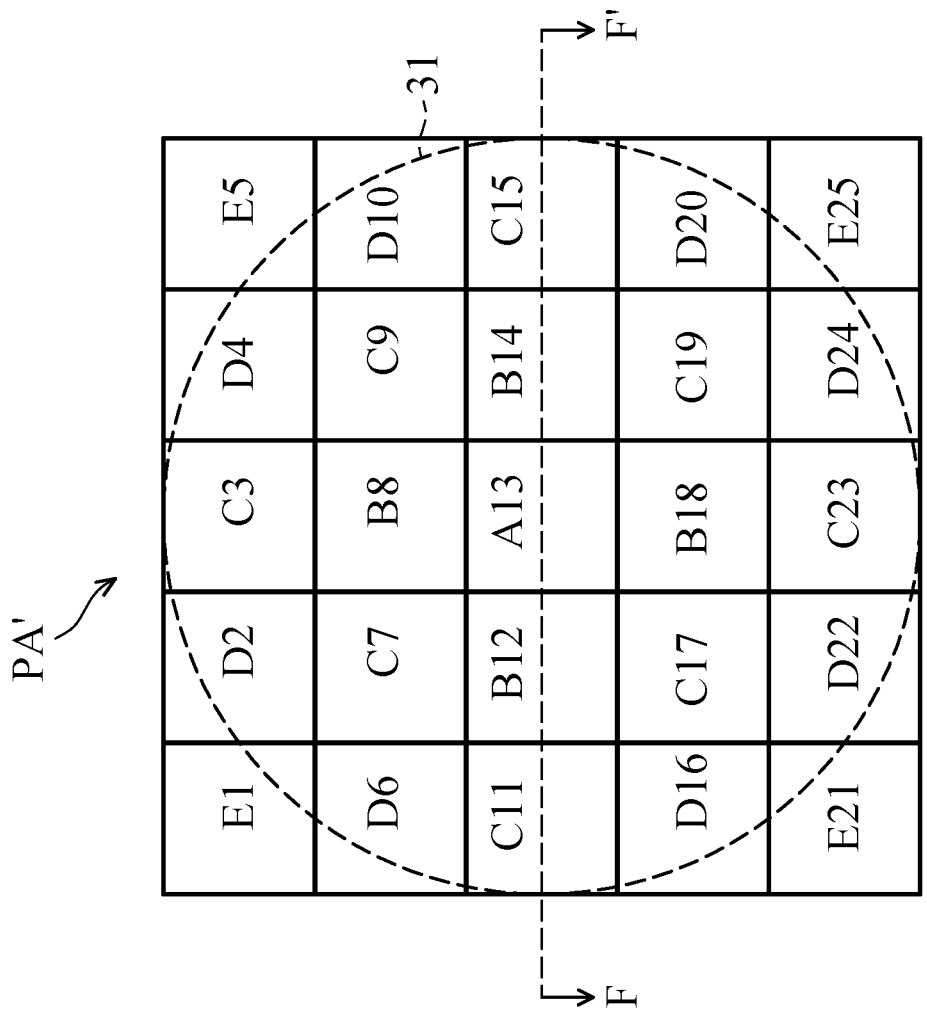
FIG. 12 is a partial top view illustrating the solid-state image sensor in accordance with one embodiment of the present disclosure.
Figure 13:
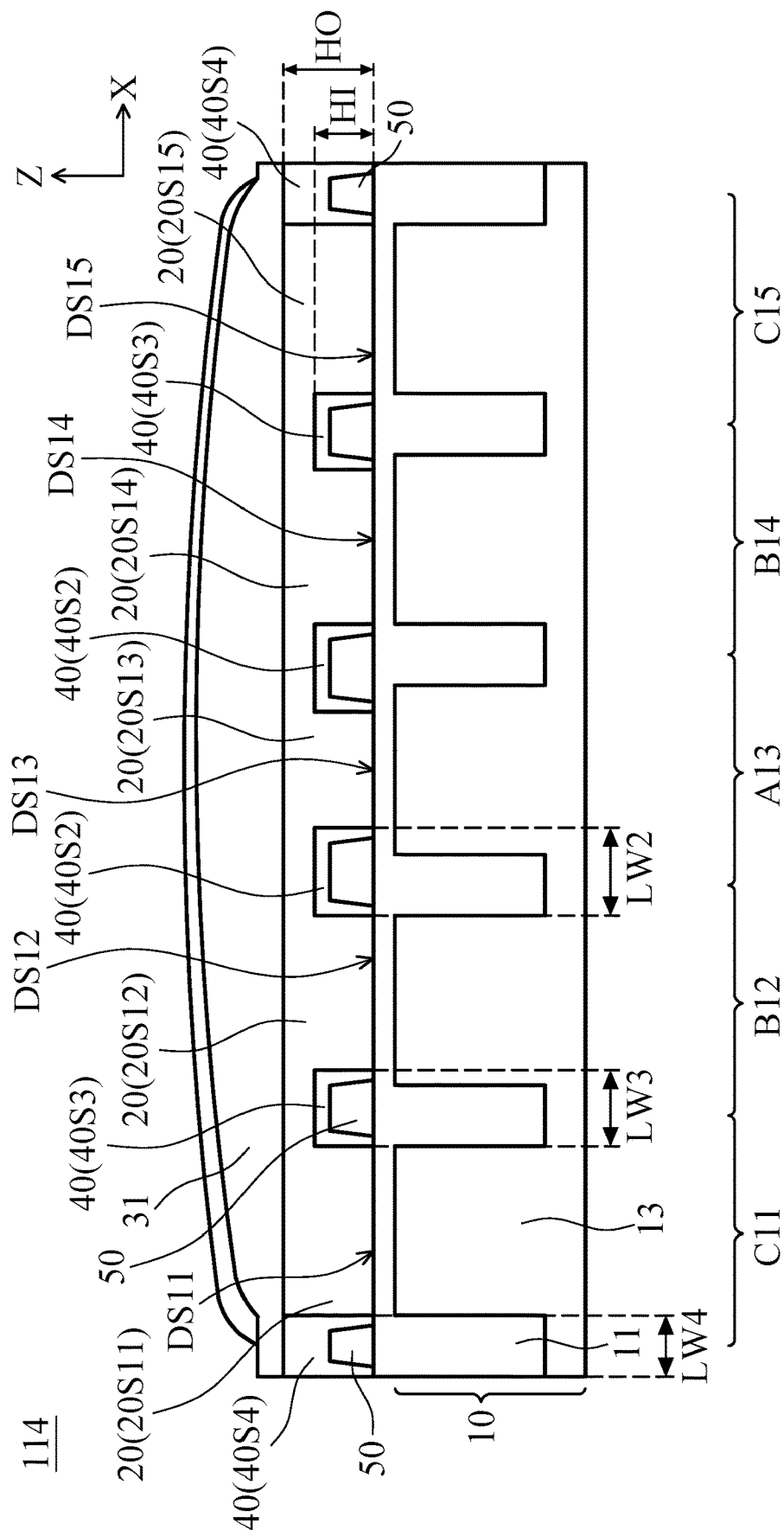
FIG. 13 is a partial cross-sectional view of the solid-state image sensor along line F-F' in FIG. 12.

In the embodiments of the present disclosure, the pixel array PA may include N×N photoelectric conversion elements, N is a positive integer larger than or equal to 3 (e.g., N=2n+1 and n is a positive integer). FIG. 12 is a partial top view illustrating the solid-state image sensor 114 in accordance with one embodiment of the present disclosure. FIG. 13 is a partial cross-sectional view of the solid-state image sensor 114 along line F-F' in FIG. 12. It should be noted that some components of the solid-state image sensor 114 may be omitted in FIG. 12 and FIG. 13 for the sake of brevity.

In the embodiment shown in FIG. 12, the pixel array PA' is a 5×5 pixel array that corresponds to 5×5 photoelectric conversion elements 13. Moreover, the aperture ratio of each pixel does not be illustrated in FIG. 12. For example, the light-adjusting structure 31 may be a converging micro-lens used for condensing incident light, and the aperture ratio of each pixel may be changed along the radiation direction of the light-adjusting structure 31. In particular, the aperture ratio of each pixel may be larger and larger along the radiation direction of the light adjustment structure 31. In the embodiment shown in FIG. 12, pixel B8, pixel B12, pixel B14, pixel B18 may have the same aperture ratio, pixel C3, pixel C7, pixel C9, pixel C11, pixel C15, pixel C17, pixel C19, pixel C23 may have the same aperture ratio, pixel D2, pixel D4, pixel D6, pixel D10, pixel D16, pixel D20, pixel D22, pixel D24 may have the same aperture ratio, pixel E1, pixel E5, pixel E21, pixel E25 may have the same aperture ratio.

In some embodiments, as shown in FIG. 13, the grid structure 40 between the modulation segment 20S13 and the modulation segment 20S12 (or the modulation segment 20S14) may have a grid width LW2 (i.e., the grid structure 40S2 shown in FIG. 13), the grid structure 40 between the modulation segment 20S12 and the modulation segment 20S11 (or between the modulation segment 20S14 and the modulation segment 20S15) may have a grid width LW3 (i.e., the grid structure 40S3 shown in FIG. 13), the grid structure 40 surrounding the modulation layer 20 may have a grid width LW4 (i.e., the grid structure 40S4 shown in FIG. 13). As shown in FIG. 13, the grid width LW2 is greater than the grid width LW3, and the grid width LW3 is greater than the grid width LW4.

Therefore, in the embodiment shown in FIG. 12 and FIG. 13, the bottom area DS13 of the modulation segment 20S13 that correspond to pixel A13 is smaller than the bottom area DS14 of the modulation segment 20S14 that correspond to pixel B14, and the bottom area DS14 of the modulation segment 20S14 that correspond to pixel B14 is smaller than the bottom area DS15 of the modulation segment 20S15 that correspond to pixel C15.

In this embodiment, as shown in FIG. 12 and FIG. 13, the grid structure 40 (and/or the metal grid 50) may determine the aperture ratio of each pixel, so that the aperture ratio of pixel A13 is smaller than the aperture ratio of pixel B8 (or pixel B12, pixel B14, or pixel B18), the aperture ratio of pixel B8 (or pixel B12, pixel B14, or pixel B18) is smaller than the aperture ratio of pixel C3 (or pixel C7, pixel C9, pixel C11, pixel C15, pixel C17, pixel C19, or pixel C23), the aperture ratio of pixel C3 (or pixel C7, pixel C9, pixel C11, pixel C15, pixel C17, pixel C19, or pixel C23) is smaller than the aperture ratio of pixel D2 (or pixel D4, pixel D6, pixel D10, pixel D16, pixel D20, pixel D22, or pixel D24), and the aperture ratio of pixel D2 (or pixel D4, pixel D6, pixel D10, pixel D16, pixel D20, pixel D22, or pixel D24) is smaller than pixel E1 (or pixel E5, pixel E21, or pixel E25).

Moreover, in some embodiments, the grid structure 40 surrounding the modulation layer 20 may have an outer height HO (i.e., the grid structure 40S4 shown in FIG. 13), the grid structure 40 between the modulation segments 20S11, 20S12, 20S13, 20S14, 20S15, and so on (i.e., the grid structure 40S2, the grid structure 40S3 shown in FIG. 13) may have an inner height HI, and the inner height HI is lower than outer height HO as shown in FIG. 13.

Figure 14:
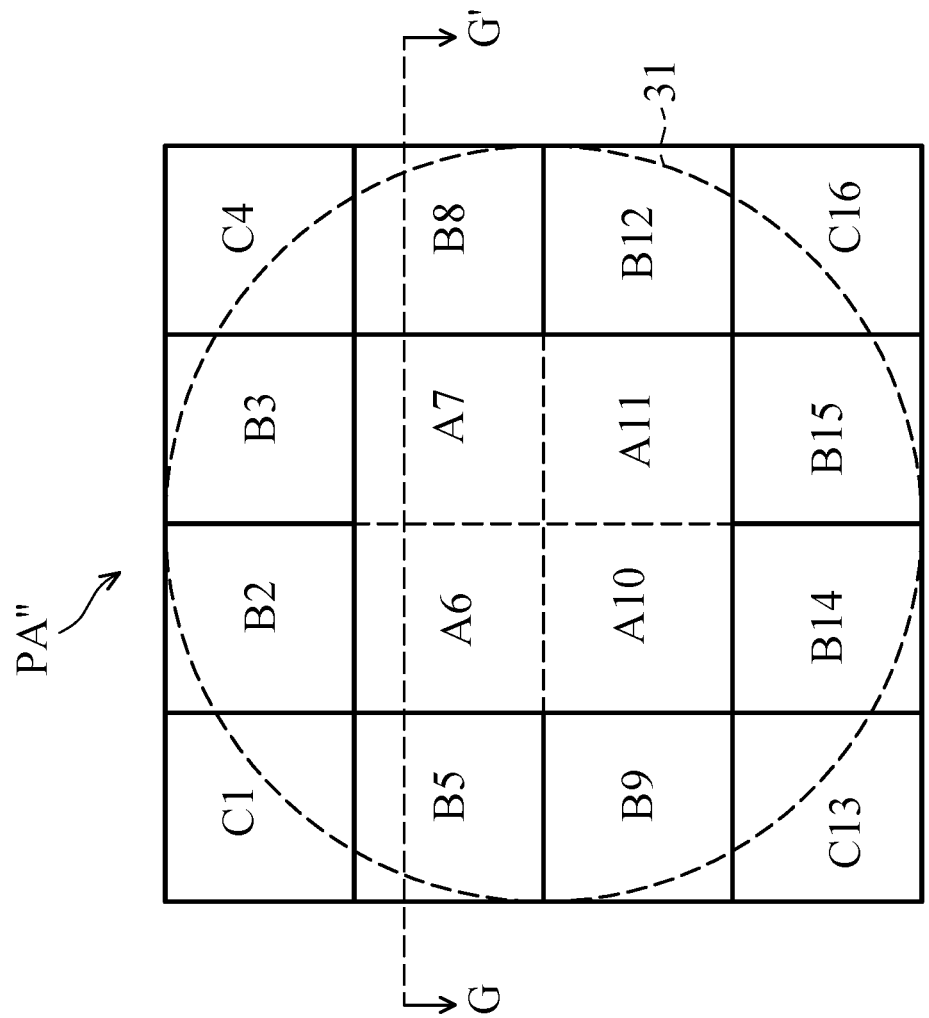
FIG. 14 is a partial top view illustrating the solid-state image sensor in accordance with another embodiment of the present disclosure.
Figure 15:
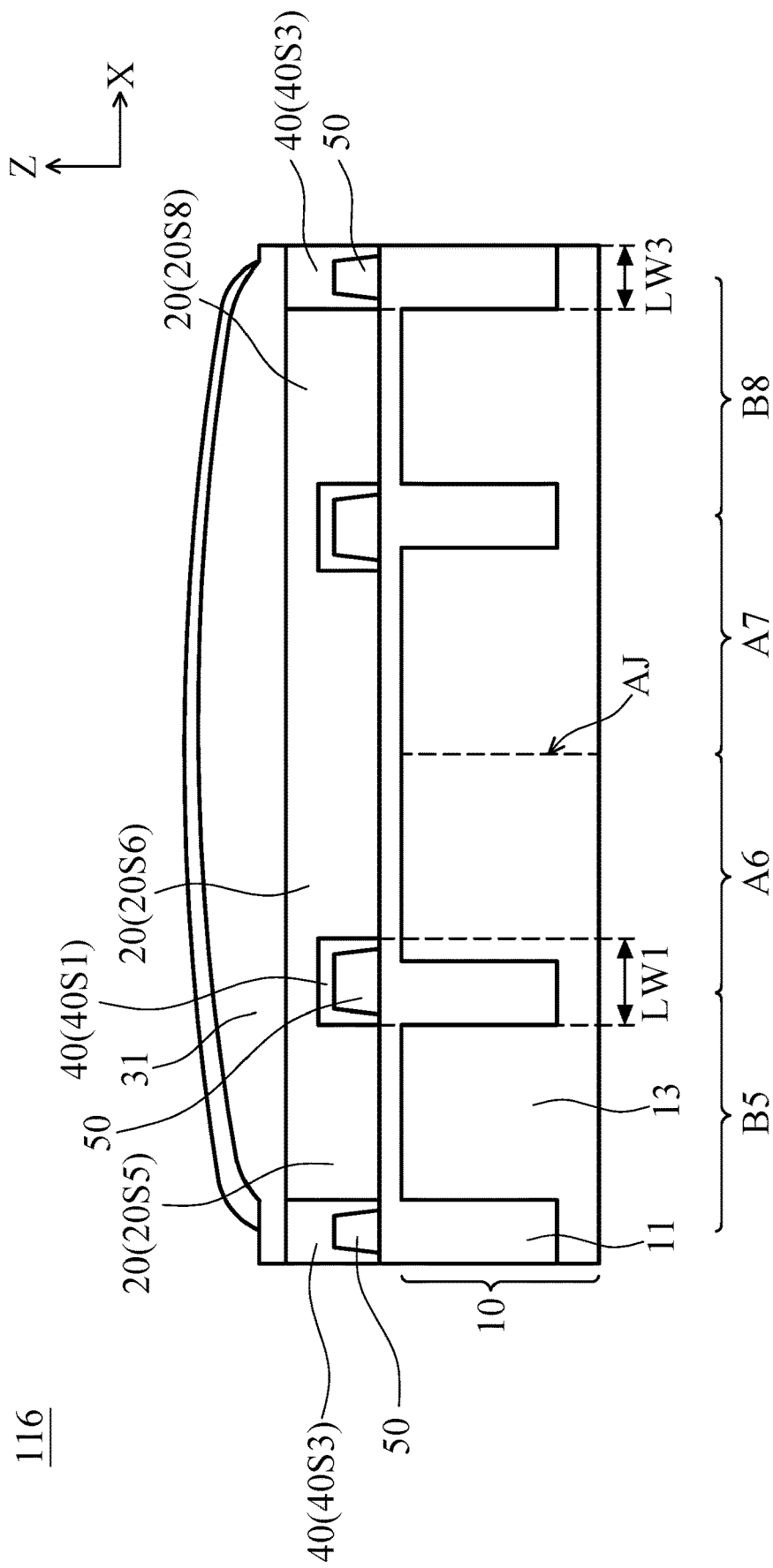
FIG. 15 is a partial cross-sectional view of the solid-state image sensor along line G-G' in FIG. 14.

In some other embodiments of the present disclosure, the pixel array PA may include N×photoelectric conversion elements, where N=2n and n is a positive integer. FIG. 14 is a partial top view illustrating the solid-state image sensor 116 in accordance with another embodiment of the present disclosure. FIG. 15 is a partial cross-sectional view of the solid-state image sensor 116 along line G-G' in FIG. 14. It should be noted that some components of the solid-state image sensor 116 may be omitted FIG. 14 and FIG. 15 for the sake of brevity.

In the embodiment shown in FIG. 14, the pixel array PA" is a 4×4 pixel array that corresponds to 4×4 photoelectric conversion elements 13. Moreover, the aperture ratio of each pixel does not be illustrated in FIG. 14. For example, the light-adjusting structure 31 may be a converging micro-lens used for condensing incident light, and the aperture ratio of each pixel may be modified along the radiation direction of the light-adjusting structure 31. In particular, the aperture ratio of each pixel may be larger and larger along the radiation direction of the light adjustment structure 31. In the embodiment shown in FIG. 14, pixel B2, pixel B3, pixel B5, pixel B8, pixel B9, pixel B12, pixel B14, pixel B15 may have the same aperture ratio, pixel C1, pixel C4, pixel C13, pixel C16 may have the same aperture ratio.

Referring to FIG. 14 and FIG. 15, in some embodiments, the modulation segment 20S6 may correspond to pixel A6, pixel A7, pixel A10, and pixel A11. In other words, the first pixel region may correspond to four (2×2) photoelectric conversion elements 13. Moreover, the four photoelectric conversion elements 13 may form P-N junctions AJ.

In the embodiment shown in FIG. 14 and FIG. 15, the grid width LW1 is greater than the grid width LW3. In this embodiment, as shown in FIG. 14 and FIG. 15, the grid structure 40 (and/or the metal grid 50) may determine the aperture ratio of each pixel, so that the aperture ratio of pixel A6 (or pixel A7, pixel A10, or pixel A11) is smaller than the aperture ratio of pixel B5 (or pixel B2, pixel B3, pixel B8, pixel B9, pixel B12, pixel B14, or pixel B15), and the aperture ratio of pixel B6 (or pixel B2, pixel B3, pixel B8, pixel B9, pixel B12, pixel B14, or pixel B15) is smaller than the aperture ratio of pixel C1 (or pixel C4, pixel C13, or pixel C16).

Figure 16:
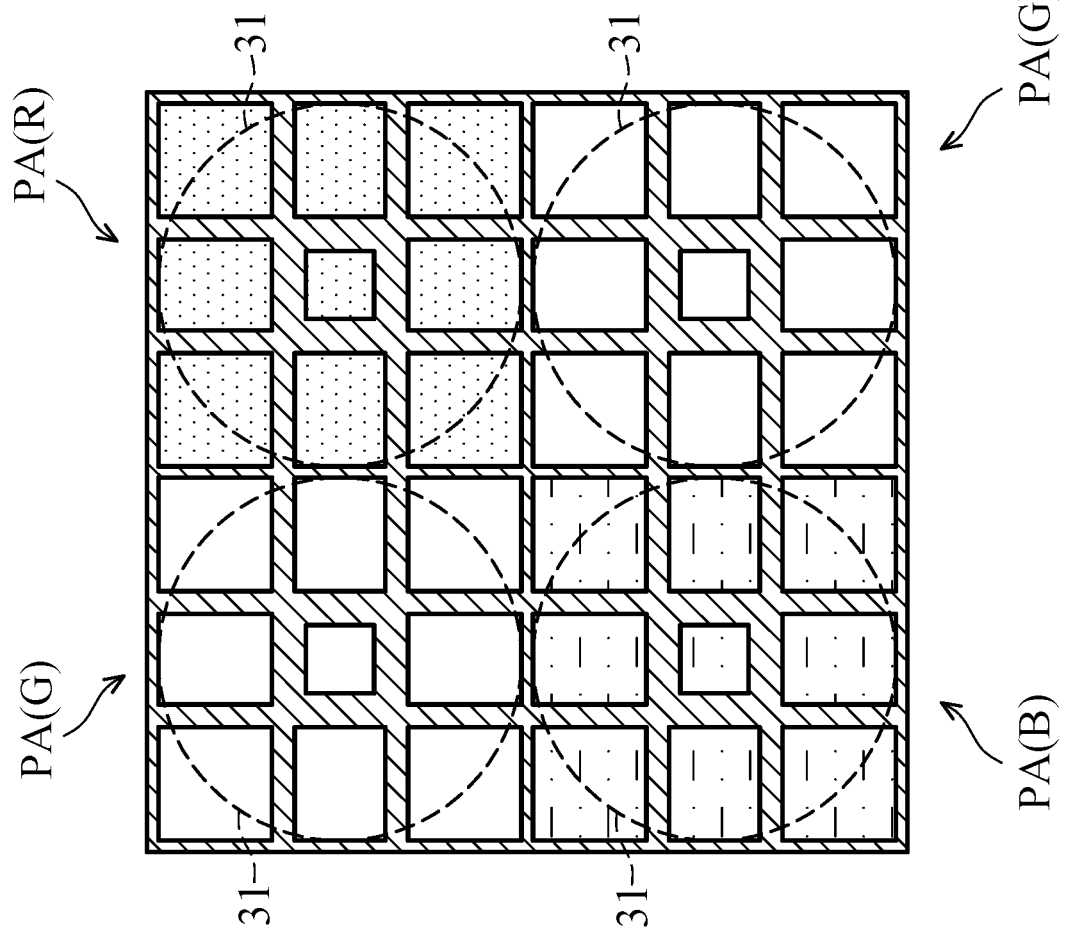
FIG. 16 is a partial top view illustrating pixel arrays of the solid-state image sensor in accordance with sonic embodiments of the present disclosure.
Figure 17:
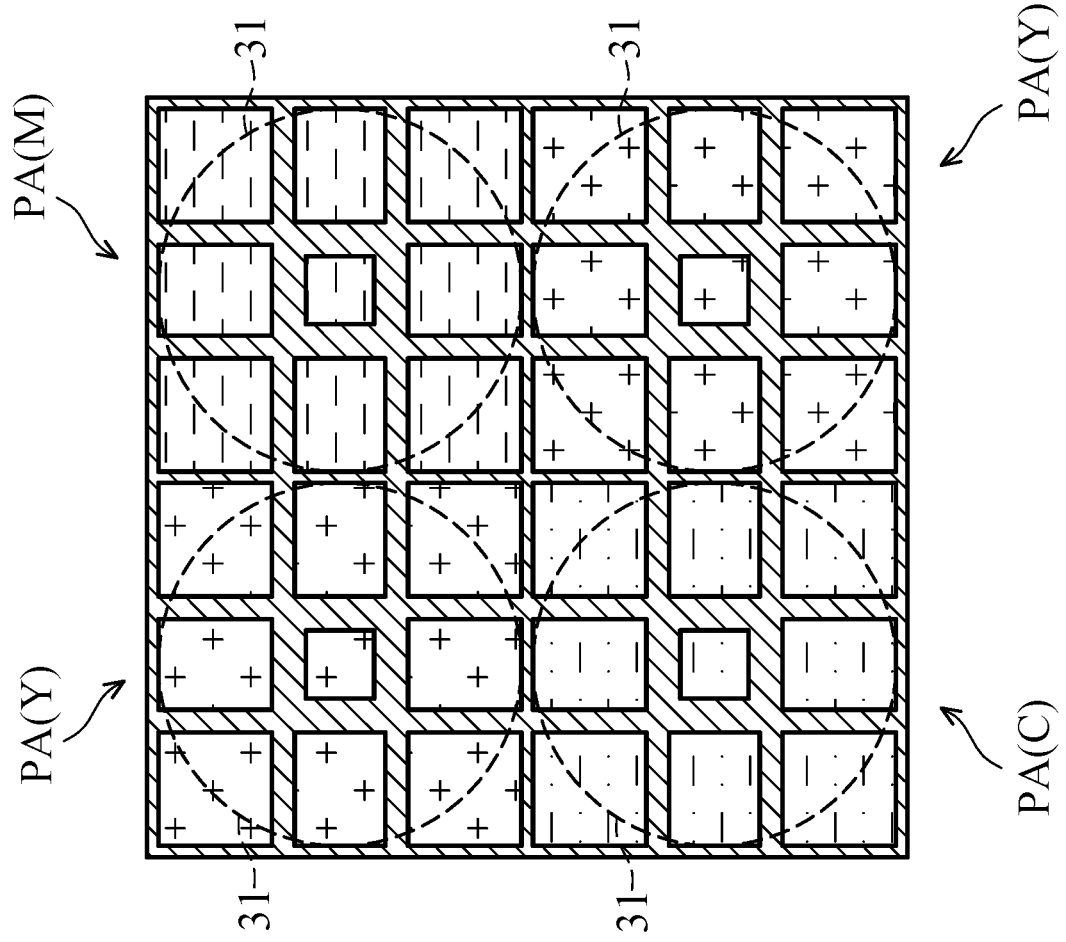
FIG. 17 is a partial top view illustrating pixel arrays of the solid-state image sensor in accordance with sonic other embodiments of the present disclosure.
Figure 18:
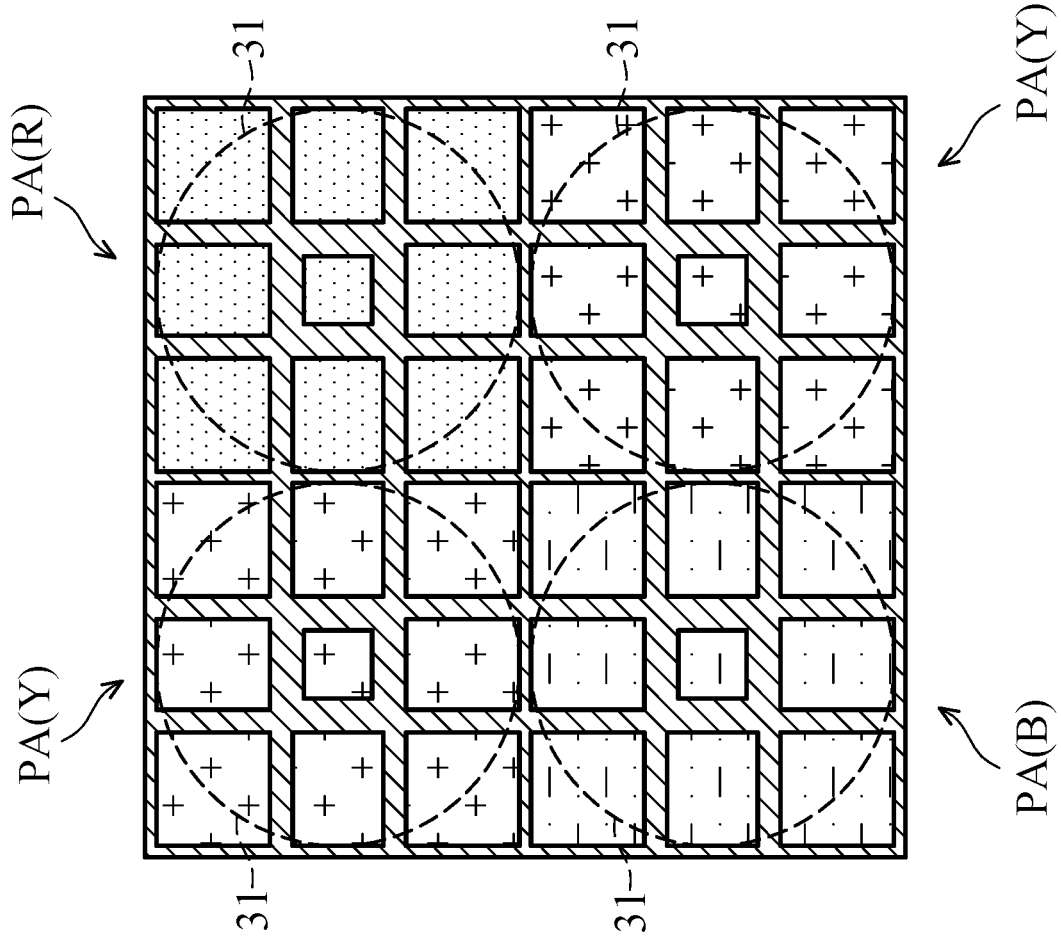
FIG. 18 is a partial top view illustrating pixel arrays of the solid-state image sensor in accordance with some other embodiments of the present disclosure.

FIG. 16 is a partial top view illustrating pixel arrays of the solid-state image sensor 100 in accordance with some embodiments of the present disclosure. FIG. 17 is a partial top view illustrating pixel arrays of the solid-state image sensor 100 in accordance with some other embodiments of the present disclosure. FIG. 18 is a partial top view illustrating pixel arrays of the solid-state image sensor 100 in accordance with some other embodiments of the present disclosure.

It should be noted that in some embodiments, the pixel array PA shown in FIG. 1 may be one of the pixel arrays shown in FIG. 16, FIG. 17, or FIG. 18. In some other embodiments, the pixel array PA shown in FIG. 3, the pixel array PA shown in FIG. 5, the pixel array PA shown in FIG. 7, the pixel array PA shown in FIG. 8, the pixel array PA' shown in FIG. 12, or the pixel array PA" shown in FIG. 14 may also be one of the pixel arrays shown in FIG. 16, FIG. 17, or FIG. 18

Referring to FIG. 16, FIG. 17, and FIG. 18, the pixel arrays may form a mosaic pattern. As shown in FIG. 16, the mosaic pattern may include red pixel arrays PA(R), green pixel arrays PA(G) and blue pixel arrays PA(B), which may be referred to as RGB arrangement. As shown in FIG. 17, the mosaic pattern may include cyan pixel arrays PA(C), magenta pixel arrays PA(M) and yellow pixel arrays PA(Y), which may be referred to as CMY) arrangement. As shown in FIG. 18, the mosaic pattern may include red pixel arrays PA(R), yellow pixel arrays PA(Y) and blue pixel arrays PA(B), which may be referred to as RYYB arrangement. However, the present disclosure is not limited to the arrangements and colors mentioned above.

In summary, according to the embodiments of the present disclosure, the solid-state image sensor includes pixel arrays, and pixels in each pixel array may have different aperture ratios. It may optimize optical allocation (e.g., prevent incident light from being concentrated into the isolation structure or prevent uneven light intensity received by the photoelectric conversion elements), thereby improving the quality of the image signal from the photoelectric conversion elements of the solid-state image sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

What is claimed is:

1. A solid-state image sensor, comprising:
   a semiconductor substrate having photoelectric conversion elements that form an N×N pixel array, N is a positive integer larger than or equal to 3;
   a modulation layer disposed above the photoelectric conversion elements; and
   a light-adjusting structure disposed on the modulation layer,
   wherein the N×N pixel array shares the light-adjusting structure and comprises:
   a first pixel region having at least one first pixel; and
   a second pixel region adjacent to the first pixel region in a first direction and in a second direction different from the first direction and having second pixels,
   wherein an aperture ratio of the at least one first pixel and an aperture ratio of one of the second pixels are different,
   wherein the light-adjusting structure is a converging micro-lens, and the solid-state image sensor further comprises:
   a grid structure disposed in the modulation layer to divide the modulation layer into a first modulation segment corresponding to the at least one first pixel and second modulation segments corresponding to the second pixels,
   wherein a material of the grid structure comprises a transparent dielectric material that has a refractive index in a range from 1 to 1.99, or the grid structure is air.

2. The solid-state image sensor as claimed in claim 1, wherein a bottom area of the first modulation segment is smaller than a bottom area of one of the second modulation segments.

3. The solid-state image sensor as claimed in claim 2, a ratio of the bottom area of the first modulation segment to the bottom area of one of the second modulation segments is smaller than 0.5, and the first modulation segment is filled with green, yellow or transparent material.

4. The solid-state image sensor as claimed in claim 1, wherein when an incident light comes from a first side of the first modulation segment, an aperture ratio of one of the second modulation segments on a second side opposite the first side of the first modulation segment is smaller than an aperture ratio of another of the second modulation segments on the first side of the first modulation segment.

5. The solid-state image sensor as claimed in claim 1, wherein the N×N pixel array further comprises a third pixel region adjacent to the second pixel region in the first direction and in the second direction and having third pixels, and an aperture ratio of one of the third pixels is different from the aperture ratio of the at least one first pixel and the aperture ratio of one of the second pixels.

6. The solid-state image sensor as claimed in claim 5, wherein the grid structure between the first modulation segment and one of the second modulation segments has a first grid width, the grid structure between one of the second modulation segments and one of the third modulation segments has a second grid width, and the first grid width is greater than the second grid width.

7. The solid-state image sensor as claimed in claim 1, wherein the light- adjusting structure is a converging micro-lens, and the solid-state image sensor further comprises:

a metal grid disposed in the modulation layer to divide the modulation layer into a first modulation segment corresponding to the at least one first pixel and second modulation segments corresponding to the second pixels, wherein the metal grid between the first modulation segment and one of the second modulation segments has a first metal width, and the metal grid surrounding the modulation layer has a second metal width, and the first metal width is greater than the second metal width.

8. The solid-state image sensor as claimed in claim 1, wherein the light-adjusting structure is a converging microlens, and a top area of one of the photoelectric conversion elements that corresponds to the at least one first pixel is smaller than a top area of another of the photoelectric conversion elements that corresponds to one of the second pixels.

9. The solid-state image sensor as claimed in claim 1, wherein the light-adjusting structure is a diverging microlens, and the solid-state image sensor further comprises:

a grid structure disposed in the modulation layer to divide the modulation layer into a first modulation segment corresponding to the at least one first pixel and second modulation segments corresponding to the second pixels wherein a material of the grid structure comprises a transparent dielectric material that has a refractive index in a range from 1 to 1.99, or the grid structure is air.

10. The solid-state image sensor as claimed in claim 9, wherein a bottom area of the first modulation segment is greater than a bottom area of one of the second modulation segments, and the solid-state image sensor further comprises:

a metal grid disposed on a bottom of the grid structure.

11. The solid-state image sensor as claimed in claim 9, wherein the N×N pixel array further comprises a third pixel region adjacent to the second pixel region in the first direction and in the second direction and having third pixels, and an aperture ratio of one of the third pixels is different from the aperture ratio of the at least one first pixel and the aperture ratio of one of the second pixels.

12. The solid-state image sensor as claimed in claim 11, wherein the grid structure between the first modulation segment and one of the second modulation segments has a first grid width, the grid structure surrounding the modulation layer has a second grid width, and the first grid width is greater than the second grid width.

13. The solid-state image sensor as claimed in claim 1, wherein the light-adjusting structure is a diverging microlens, and the solid-state image sensor further comprises:

a metal grid disposed in the modulation layer to divide the modulation layer into a first modulation segment corresponding to the at least one first pixel and second modulation segments corresponding to the second pixels, wherein the metal grid between the first modulation segment and one of the second modulation segments has a first metal width, the metal grid surrounding the modulation layer has a second metal width, and the first metal width is greater than the second metal width.

14. The solid-state image sensor as claimed in claim 1, wherein the light-adjusting structure is a diverging microlens, and a top area of one of the photoelectric conversion elements that corresponds to the at least one first pixel is greater than a top area of another of the photoelectric conversion elements that corresponds to one of the second pixels.

15. The solid-state image sensor as claimed in claim 1, further comprising:

a grid structure disposed in the modulation layer;
a color filter layer disposed on the modulation layer; and
an air gap disposed in the grid structure that corresponds to a space between the first pixel region and the second pixel region, wherein a refractive index of the grid structure is lower than a refractive index of the modulation layer.

16. The solid-state image sensor as claimed in claim 1, further comprising:

a grid structure disposed in the modulation layer; and
a color filter layer disposed on the modulation layer;
wherein a refractive index of the grid structure is lower than a refractive index of the modulation layer, and a ratio of a thickness of the modulation layer to a thickness of the color filter layer is between 0.25 and 1.

17. The solid-state image sensor as claimed in claim 1, wherein aperture ratios in the N×N pixel array are changed along a radiation direction of the light-adjusting structure.

18. The solid-state image sensor as claimed in claim 1, wherein when N=2n and n is a positive integer, the first pixel region corresponds to four photoelectric conversion elements, and the four photoelectric conversion elements form P-N junctions.

19. The solid-state image sensor as claimed in claim 1, wherein the pixel arrays form a mosaic pattern, and the mosaic pattern comprises RGB arrangement, CMY arrangement or RYYB arrangement.

* * * * *